US011279716B2

(12) United States Patent
Oh et al.

(10) Patent No.: US 11,279,716 B2
(45) Date of Patent: *Mar. 22, 2022

(54) NITROGEN-CONTAINING CYCLIC COMPOUND, COLOR CONVERSION FILM COMPRISING SAME, AND BACKLIGHT UNIT AND DISPLAY DEVICE COMPRISING SAME

(71) Applicant: LG CHEM, LTD., Seoul (KR)

(72) Inventors: Hye Mi Oh, Daejeon (KR); Dong Mok Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 208 days.

This patent is subject to a terminal disclaimer.

(21) Appl. No.: 16/321,348

(22) PCT Filed: Jul. 28, 2017

(86) PCT No.: PCT/KR2017/008151
§ 371 (c)(1),
(2) Date: May 6, 2019

(87) PCT Pub. No.: WO2018/021866
PCT Pub. Date: Feb. 1, 2018

(65) Prior Publication Data
US 2019/0263836 A1    Aug. 29, 2019

(30) Foreign Application Priority Data
Jul. 29, 2016 (KR) .................. 10-2016-0097208

(51) Int. Cl.
C07F 5/02        (2006.01)
F21K 9/64        (2016.01)
(Continued)

(52) U.S. Cl.
CPC ............... *C07F 5/022* (2013.01); *C07F 5/02* (2013.01); *F21K 9/64* (2016.08); *G02B 5/22* (2013.01);
(Continued)

(58) Field of Classification Search
CPC . C07F 5/02; C07F 5/022; G02B 26/00; G02B 26/007; G02B 5/22; G02B 5/223;
(Continued)

(56) References Cited

U.S. PATENT DOCUMENTS 4,774,339 A      9/1988 Haugland et al.
10,544,166 B2 *  1/2020 Lee ........................... F21K 9/64
(Continued)

FOREIGN PATENT DOCUMENTS

CN    105684180 A    6/2016
CN    107849065 A    3/2018
(Continued)

OTHER PUBLICATIONS

Yu et al., "α-/β-Formylated Boron-Dipyrrin (BODIPY) Dyes: Regioselective Syntheses and Photophysical Properties", Eur. J. Org. Chem., 2011, pp. 5460-5468.
(Continued)

*Primary Examiner* — Eli D. Strah
(74) *Attorney, Agent, or Firm* — Rothwell, Figg, Ernst & Manbeck, P.C.

(57) ABSTRACT

The present specification relates to a cyclic compound containing nitrogen, and a color conversion film, a backlight unit, and a display apparatus, including the same.

10 Claims, 1 Drawing Sheet

(51) Int. Cl.
| | |
|---|---|
| *F21V 8/00* | (2006.01) |
| *G02B 26/00* | (2006.01) |
| *G02B 5/22* | (2006.01) |
| *G02F 1/1335* | (2006.01) |
| *H01L 51/00* | (2006.01) |
| *F21Y 115/10* | (2016.01) |
| *C09K 11/06* | (2006.01) |
| *G02F 1/13357* | (2006.01) |

(52) U.S. Cl.
CPC ............ *G02B 6/005* (2013.01); *G02B 26/00* (2013.01); *G02F 1/1335* (2013.01); *H01L 51/00* (2013.01); *B32B 2457/20* (2013.01); *B32B 2457/202* (2013.01); *B32B 2457/206* (2013.01); *C09K 11/06* (2013.01); *C09K 2211/1029* (2013.01); *C09K 2323/03* (2020.08); *C09K 2323/031* (2020.08); *F21Y 2115/10* (2016.08); *G02F 1/133514* (2013.01); *G02F 1/133602* (2013.01)

(58) Field of Classification Search
CPC . G02B 6/005; G02F 1/1335; G02F 1/133514; G02F 1/133602; G02F 1/133615; H01L 51/00; H01L 51/008; F21K 9/64; B32B 2457/20; B32B 2457/202; B32B 2457/206; C09K 2323/03; C09K 2323/031; C09K 11/06; C09K 2211/1029; C09K 2211/186; F21Y 2115/10

See application file for complete search history.

(56) References Cited

U.S. PATENT DOCUMENTS

| | | | |
|---|---|---|---|
| 10,703,768 B2* | 7/2020 | Sung | G02B 6/005 |
| 2008/0076044 A1 | 3/2008 | Mizukawa et al. | |
| 2008/0102534 A1* | 5/2008 | Ulrich | C07F 5/02 436/172 |
| 2012/0037890 A1 | 2/2012 | Okuda et al. | |
| 2012/0070836 A1 | 3/2012 | Zillmann et al. | |
| 2013/0088684 A1 | 4/2013 | Harding et al. | |
| 2015/0303377 A1 | 10/2015 | Thompson et al. | |
| 2015/0303378 A1 | 10/2015 | Han et al. | |
| 2016/0190469 A1 | 6/2016 | Ogiwara et al. | |
| 2016/0312113 A1 | 10/2016 | Murakami et al. | |
| 2017/0260212 A1 | 9/2017 | Lee et al. | |
| 2017/0349822 A1 | 12/2017 | Lee et al. | |
| 2018/0186817 A1 | 7/2018 | Lee et al. | |
| 2019/0093008 A1* | 3/2019 | Shin | G02B 5/223 |
| 2020/0040011 A1* | 2/2020 | Oh | G02B 6/005 |
| 2020/0199158 A1* | 6/2020 | Oh | C08K 5/55 |

FOREIGN PATENT DOCUMENTS

| | | | |
|---|---|---|---|
| EP | 3305870 A1 | 4/2018 | |
| EP | 3550206 A1 | 10/2019 | |
| JP | H08-6245 A | 1/1996 | |
| JP | 2009-031713 A | 2/2009 | |
| JP | 2011-241160 A | 12/2011 | |
| JP | 2011241160 A * | 12/2011 | |
| JP | 2013-533738 A | 8/2013 | |
| JP | 2014-527645 A | 10/2014 | |
| JP | 2015-163676 A | 9/2015 | |
| JP | 2018-081250 A | 5/2018 | |
| KR | 10-2011-0126637 A | 11/2011 | |
| KR | 10-2015-0020297 A | 2/2015 | |
| KR | 10-1590299 B1 | 2/2016 | |
| KR | 10-2016-0051148 A | 5/2016 | |
| WO | 2016-108411 A1 | 7/2016 | |
| WO | 2016-190283 A1 | 12/2016 | |
| WO | 2017-057074 A1 | 4/2017 | |
| WO | WO-2017073923 A1 * | 5/2017 | ............... C07F 5/02 |
| WO | 2018-101129 A1 | 6/2018 | |

OTHER PUBLICATIONS

Lundrigan T. et al., "Activation and deprotection of F-BODIPYs using boron trihalides", Chem. Commun., 2014, v.50, pp. 7028-7031.
Marchal et al., "Synthesis and antimalarial activity of prodigiosenes", Org. Biomol. Chem., 2014, v.12, pp. 4132-4142.
Lundrigan et al., "An Improved Method for the Synthesis of F-BODIPYs from Dipyrrins and Bis(dipyrrin)s", Org. Lett., 2012, v.14, pp. 2158-2161.
Crawford et al., "Synthesis and Characterization of Fluorescent Pyrrolyldipyrrinato Sn(IV) Complexes", Inorg. Chem., 2011, v.50, pp. 8207-8213.
Falk et al., "Beiträge zur Chemie der Pyrrolpigmente, 5. Mitt. Die N—H-Tautomerie von substituierten Pyrromethenen: Konformationsanalytische Studien mit Hilfe der Lanthaniden-Verschiebungstechnik", Monatshefte fur Chemie, 1974, v.105, pp. 1004-1018.
Wang et al., "Synthesis and photo-property of 2-cyano boron-dipyrromethene and the application for detecting fluoride ion", Tetrahedron 2015, v.71, pp. 9611-9616.
Wen et al., "A high-resolution method to assess cell multinucleation with cytoplasm-localized fluorescent probes", Analyst, 2016, v.141, pp. 4010-4013.
Krumova et al., "Bodipy Dyes with Tunable Redox Potentials and Functional Groups for Further Tethering: Preparation, Electrochemical, and Spectroscopic Characterization", J. Am. Chem. Soc., 2010, v.132, pp. 17560-17569.
Ulrich et al., "Carbonyl Derivatives of Boradiazaindacene via Catalytic CO Insertion", J. Org. Chem., 2012, v.77, pp. 5036-5048.
Menges, "Computational study an aromaticity and resonance structures of substituted BODIPY derivatives", Computational and Theoretical Chemistry, 2015, v.1068, pp. 117-122.
Gupta et al., "Rational Design of Boradiazaindacene (BODIPY)-Based Functional Molecules", Chem. Eur. J., 2013, v.19, pp. 17766-17772.
Esnal et al., "Nitro and amino BODIPYS: crucial substituents to modulate their photonic behavior", RSC Adv., 2013, v.3, pp. 1547-1556.
Zhang et al., "A dual channel chemodosimeter for Hg2+ and Ag+ using a 1,3-dithiane modified BODIPY", New J. Chem., 2012, v.36, pp. 1621-1625.
Kesavan et al., "Carbazole substituted boron dipyrromethenes", Dalton Trans., 2014, v.43, pp. 12405-12413.
Verbelen et al., "Radical C—H Alkylation of BODIPY Dyes Using Potassium Trifluoroborates or Boronic Acids", Chem. Eur. J., 2015, 21, pp. 12667-12675.
International Search Report issued for PCT Application No. PCT/KR2017/008151 dated Nov. 7, 2017, 2 pages.

* cited by examiner

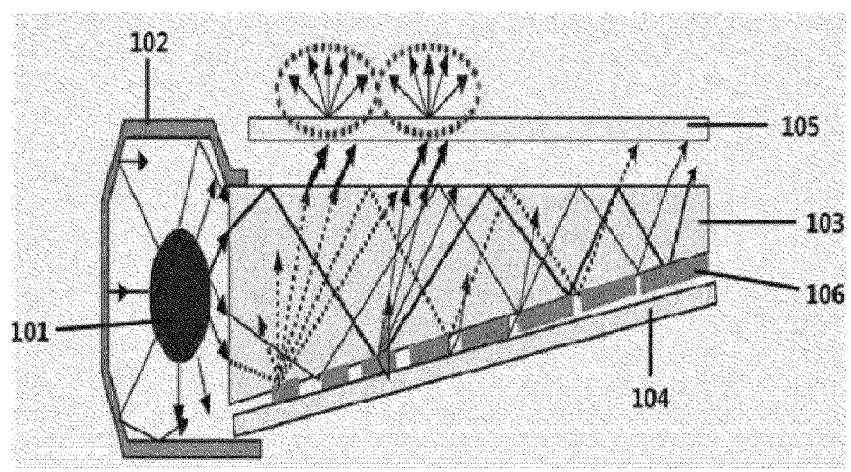

NITROGEN-CONTAINING CYCLIC COMPOUND, COLOR CONVERSION FILM COMPRISING SAME, AND BACKLIGHT UNIT AND DISPLAY DEVICE COMPRISING SAME

TECHNICAL FIELD

The present specification relates to a cyclic compound containing nitrogen, and a color conversion film, a backlight unit, and a display apparatus including the same.

This specification claims priority to and the benefit of Korean Patent Application No. 10-2016-0097208 filed in the Korean Intellectual Property Office on Jul. 29, 2016, the entire contents of which are incorporated herein by reference.

BACKGROUND ART

The existing light emitting diodes (LEDs) are obtained by mixing a green phosphor and a red phosphor with a blue light emitting diode or mixing a yellow phosphor and a blue-green phosphor with a light emitting diode emitting UV light. However, in this method, it is difficult to control colors, and accordingly, the color rendition is not good. Therefore, the color gamut deteriorates.

In order to overcome the deterioration in the color gamut and reduce the production costs, methods of implementing green and red colors have been recently attempted by using a method of producing a quantum dot in the form of a film and combining the same with a blue LED. However, cadmium-based quantum dots have safety problems, and the other quantum dots have much lower efficiencies than those of the cadmium-based quantum dots. Further, quantum dots have low stability against oxygen and water, and have a disadvantage in that the performance thereof significantly deteriorates when the quantum dots are aggregated. In addition, when quantum dots are produced, it is difficult to constantly maintain the size thereof, and thus, the production cost is high.

DISCLOSURE

Technical Problem

The present specification provides a cyclic compound containing nitrogen, and a color conversion film, a backlight unit, and a display apparatus including the same.

Technical Solution

An exemplary embodiment of the present specification provides a compound represented by the following Chemical Formula 1.

[Chemical Formula 1]

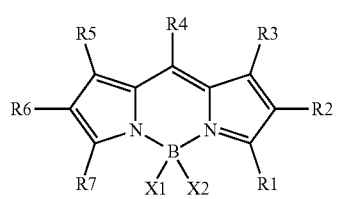

In Chemical Formula 1,

R2 is a cyano group; a nitro group; an imide group; an amide group; a carbonyl group; an ester group; a substituted or unsubstituted fluoroalkyl group; a substituted or unsubstituted sulfonyl group; or a substituted or unsubstituted sulfonamide group, R6 is hydrogen; deuterium; a substituted or unsubstituted alkyl group; a substituted or unsubstituted cycloalkyl group; a substituted or unsubstituted alkoxy group; or a substituted or unsubstituted aryloxy group, R1, R3 to R5, and R7 are the same as or different from each other, and are each independently hydrogen; deuterium; a nitro group; a substituted or unsubstituted ester group; a substituted or unsubstituted alkyl group; a substituted or unsubstituted fluoroalkyl group; a substituted or unsubstituted cycloalkyl group; a substituted or unsubstituted alkoxy group; a substituted or unsubstituted aryloxy group; a substituted or unsubstituted aryl group; a substituted or unsubstituted heteroaryl group; or a substituted or unsubstituted aliphatic heterocyclic group, and X1 and X2 are the same as or different from each other, and are each independently a halogen group; a cyano group; a nitro group; an imide group; an amide group; a carbonyl group; an ester group; a substituted or unsubstituted fluoroalkyl group; a substituted or unsubstituted sulfonyl group; a substituted or unsubstituted sulfonamide group; a substituted or unsubstituted alkoxy group; a substituted or unsubstituted aryloxy group; or a substituted or unsubstituted aryl group, or X1 and X2 are bonded to each other to form a substituted or unsubstituted ring.

Another exemplary embodiment of the present specification provides a color conversion film including: a resin matrix; and the compound represented by Chemical Formula 1, which is dispersed in the resin matrix.

Still another exemplary embodiment of the present specification provides a backlight unit including the color conversion film.

Yet another exemplary embodiment of the present specification provides a display apparatus including the backlight unit.

Advantageous Effects

When an electron-withdrawing group is asymmetrically bonded to R2 or R6, a compound according to an exemplary embodiment of the present specification is a green light-emitting material having high fluorescence efficiency in a short wavelength region and excellent light fastness. Therefore, by using the compound described in the present specification as a fluorescent material of a color conversion film, it is possible to provide a color conversion film which has excellent brightness and color gamut and excellent light fastness.

DESCRIPTION OF DRAWINGS

FIG. 1 is a schematic view in which a color conversion film according to an exemplary embodiment of the present specification is applied to a backlight unit.

MODE FOR INVENTION

Hereinafter, the present specification will be described in more detail.

An exemplary embodiment of the present specification provides the compound represented by Chemical Formula 1.

When an electron-withdrawing group is bonded to the R2 position of a core structure, the compound according to an exemplary embodiment of the present specification is characterized by emitting green light in a short wavelength region, and particularly, an asymmetric compound in which an electron-withdrawing group is bonded to R2 and hydrogen is bonded to R6 emits green light in a shorter wavelength region than a symmetric compound in which both R2 and R6 are an electron-withdrawing group. Accordingly, when a color conversion film includes the compound, a color conversion film having excellent color gamut may be manufactured.

In particular, the case where R6 is hydrogen has a shorter conjugation of a BODIPY structure than the case where R6 has another substituent such as aryl, and thus emits light in a shorter wavelength region, and the case where R6 is hydrogen has an effect of emitting light in a short wavelength region while an energy level is stabilized by lowering an electron density in the BODIPY than the case where R2 has a substituent such as halogen by substituting the electron-withdrawing group of the present invention, and the durability is improved.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a cyano group; a nitro group; a carbonyl group; a carboxyl group (—COOH); an ether group; an ester group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted aryl group; and a substituted or unsubstituted heterocyclic group or being substituted with a substituent to which two or more substituents are linked among the substituents exemplified above, or having no substituent. For example, "the substituent to which two or more substituents are linked" may be a biphenyl group. That is, the biphenyl group may also be an aryl group, and may be interpreted as a substituent to which two phenyl groups are linked.

In the present specification, means a moiety bonded to another substituent or a bonding portion.

In the present specification, a halogen group may be fluoro, chlorine, bromine, or iodine.

In the present specification, the number of carbon atoms of an imide group is not particularly limited, but is preferably 1 to 30. Specifically, the imide group may be a compound having the following structures, but is not limited thereto.

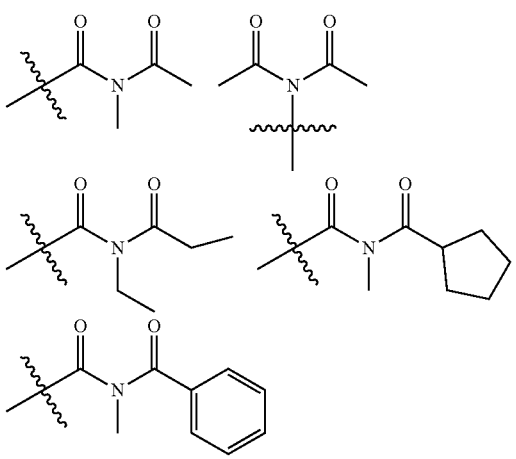

In the present specification, for an amide group, the nitrogen of the amide group may be substituted with hydrogen, a straight, branched, or cyclic alkyl group having 1 to 30 carbon atoms, or an aryl group having 6 to 30 carbon atoms. Specifically, the amide group may be a compound having the following structural formulae, but is not limited thereto.

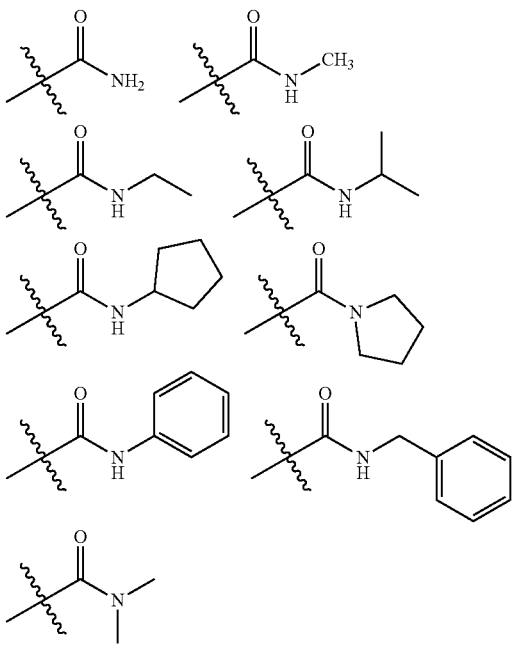

In the present specification, the number of carbon atoms of a carbonyl group is not particularly limited, but is preferably 1 to 30. Specifically, the carbonyl group may be a compound having the following structures, but is not limited thereto.

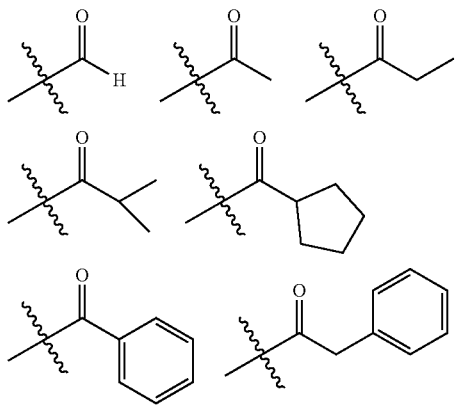

In the present specification, for an ether group, the oxygen of the ether may be substituted with a straight, branched, or cyclic alkyl group having 1 to 25 carbon atoms, or a monocyclic or polycyclic aryl group having 6 to 30 carbon atoms.

In the present specification, for an ester group, the carbon of the ester group may be substituted with one or two substituents from the group consisting of a straight, branched, or cyclic alkyl group having 1 to 25 carbon atoms; a straight or branched fluoroalkyl group having 1 to 20 carbon atoms; and a monocyclic or polycyclic aryl group having 6 to 30 carbon atoms. Specifically, the ester group may be a compound having the following structural formulae, but is not limited thereto.

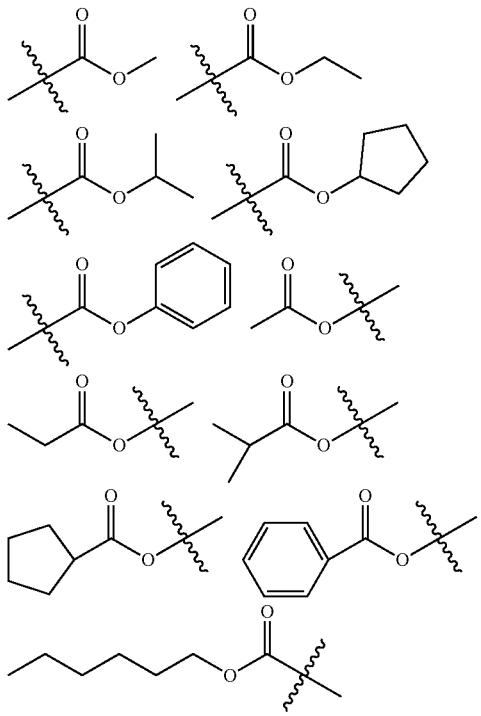

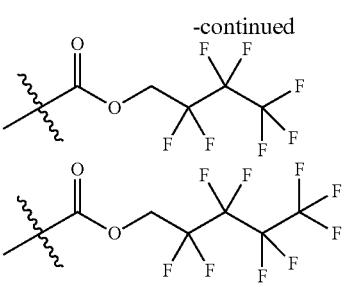

In the present specification, a fluoroalkyl group may be straight or branched, and the number of carbon atoms thereof is not particularly limited, but is preferably 1 to 30. Specifically, examples of the fluoroalkyl group include a trifluoromethyl group, a perfluoroethyl group, and the like, but are not limited thereto.

In the present specification, a sulfonyl group may be $-SO_2R_{100}$, and $R_{100}$ may be selected from the group consisting of hydrogen; deuterium; a halogen group; a nitrile group; a substituted or unsubstituted monocyclic or polycyclic cycloalkyl group having 3 to 30 carbon atoms; a substituted or unsubstituted straight or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, a sulfonamide group may be $-SO_2NR_{101}R_{102}$ or $-NR_{101}SO_2R_{102}$, and $R_{101}$ and $R_{102}$ are the same as or different from each other, and may be each independently selected from the group consisting of hydrogen; deuterium; a halogen group; a nitrile group; a substituted or unsubstituted monocyclic or polycyclic cycloalkyl group having 3 to 30 carbon atoms; a substituted or unsubstituted straight or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, the alkyl group may be straight or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight, branched, or cyclic. The number of carbon atoms of the alkoxy group is not particularly limited, but is preferably 1 to 30. Specific examples thereof include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, an aryl group is not particularly limited, but has preferably 6 to 30 carbon atoms, and the aryl group may be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a triphenyl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the fluorenyl group may be

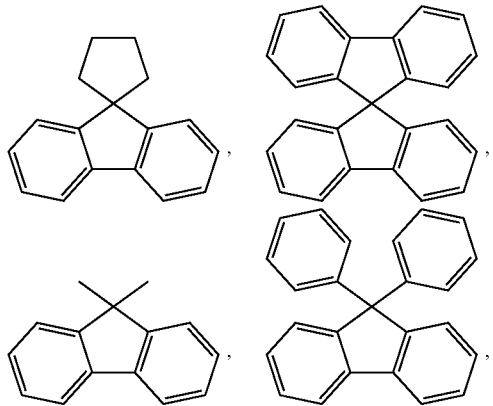

and the like. However, the fluorenyl group is not limited thereto.

In the present specification, an aryl group of an aryloxy group is the same as the above-described examples of the aryl group. Specifically, examples of the aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, a heteroaryl group includes one or more atoms other than carbon, that is, one or more heteroatoms, and specifically, the heteroatom may include one or more atoms selected from the group consisting of O, N, Se, and S, and the like. The number of carbon atoms thereof is not particularly limited, but is preferably 2 to 30, and the heteroaryl group may be monocyclic or polycyclic. Examples of a heterocyclic group include a thiophene group, a furanyl group, a pyrrole group, an imidazolyl group, a triazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a qinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group (phenanthroline), an isoxazolyl group, a thiadiazolyl group, a phenothiazinyl group, a dibenzofuranyl group, and the like, but are not limited thereto.

In the present specification, a heterocyclic group may be monocyclic or polycyclic, may be an aromatic ring, an aliphatic ring, or a fused ring of the aromatic ring and the aliphatic ring, and may be selected from the examples of the heteroaryl group.

In the present specification, an aliphatic heterocyclic group may be monocyclic or polycyclic, and specifically, may be a tetrahydropyran group, but is not limited thereto.

According to an exemplary embodiment of the present specification, R4 is hydrogen; a substituted or unsubstituted alkyl group; a substituted or unsubstituted aryl group; or a substituted or unsubstituted cycloalkyl group.

According to an exemplary embodiment of the present specification, R4 is hydrogen; an alkyl group; an aryl group unsubstituted or substituted with a cyano group, a halogen group, a nitro group, a fluoroalkyl group, an ester group, an alkoxy group, an alkyl group, or an aryl group; or a cycloalkyl group.

According to an exemplary embodiment of the present specification, R4 is hydrogen; an alkyl group; a phenyl group unsubstituted or substituted with a cyano group, a halogen group, a nitro group, a fluoroalkyl group, an ester group, an alkoxy group, an alkyl group, or an aryl group; or a cyclohexyl group.

According to an exemplary embodiment of the present specification, R4 is hydrogen; a methyl group; a phenyl group unsubstituted or substituted with a cyano group, F, a nitro group, a fluoromethyl group, an ester group, a methoxy group, a methyl group, a propyl group, or a phenyl group; or a cyclohexyl group.

According to an exemplary embodiment of the present specification, R4 is a substituted or unsubstituted aryl group; or a substituted or unsubstituted cycloalkyl group.

According to an exemplary embodiment of the present specification, R4 is an aryl group; or a cycloalkyl group.

According to an exemplary embodiment of the present specification, R4 is a substituted or unsubstituted phenyl group; a substituted or unsubstituted biphenyl group; a substituted or unsubstituted terphenyl group; a substituted or unsubstituted naphthyl group; a substituted or unsubstituted cyclohexyl group; a substituted or unsubstituted cyclopentyl group; a substituted or unsubstituted cycloheptyl group; a substituted or unsubstituted bicycloheptyl group; or a substituted or unsubstituted cyclooctyl group.

According to an exemplary embodiment of the present specification, R4 is a phenyl group; a terphenyl group; a biphenyl group; a naphthyl group; a cyclohexyl group; a cyclopentyl group; a cycloheptyl group; a bicycloheptyl group; or a cyclooctyl group.

According to an exemplary embodiment of the present specification, R4 is a substituted or unsubstituted phenyl group; a substituted or unsubstituted terphenyl group; or a substituted or unsubstituted cyclohexyl group.

According to an exemplary embodiment of the present specification, R4 is a phenyl group unsubstituted or substituted with a cyano group, a nitro group, a halogen group, an alkyl group, a fluoroalkyl group, an ester group, or an alkoxy group; a terphenyl group unsubstituted or substituted with a cyano group, a nitro group, a halogen group, an alkyl group, a fluoroalkyl group, an ester group, or an alkoxy group; or a cyclohexyl group unsubstituted or substituted with a cyano group, a nitro group, a halogen group, an alkyl group, a fluoroalkyl group, an ester group, or an alkoxy group.

According to an exemplary embodiment of the present specification, R4 is a phenyl group unsubstituted or substituted with a cyano group, a nitro group, F, a methyl group, a propyl group, a trifluoromethyl group,

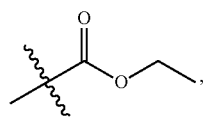 [SMILES: *C(=O)OCC]

or a methoxy group; a terphenyl group unsubstituted or substituted with a cyano group, a nitro group, F, a methyl group, a propyl group, a trifluoromethyl group,

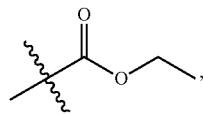 [SMILES: *C(=O)OCC]

or a methoxy group; or a cyclohexyl group unsubstituted or substituted with a cyano group, a nitro group, F, a methyl group, a propyl group, a trifluoromethyl group,

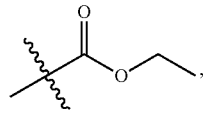 [SMILES: *C(=O)OCC]

or a methoxy group.

According to an exemplary embodiment of the present specification, R4 is a phenyl group unsubstituted or substituted with a cyano group, a nitro group, F, a methyl group, a propyl group, a trifluoromethyl group,

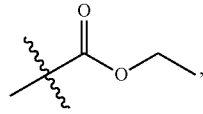

or a methoxy group, or terphenyl group.

According to an exemplary embodiment of the present specification, R4 is a phenyl group or a terphenyl group.

According to an exemplary embodiment of the present specification, R4 is a phenyl group.

According to an exemplary embodiment of the present specification, R1, R3, R5, and R7 are the same as or different from each other, and are each independently hydrogen; a substituted or unsubstituted alkyl group; a substituted or unsubstituted cycloalkyl group; a substituted or unsubstituted aryl group; a substituted or unsubstituted heteroaryl group; or a substituted or unsubstituted aliphatic heterocyclic group.

According to an exemplary embodiment of the present specification, R1, R3, R5, and R7 are the same as or different from each other, and are each independently hydrogen; a substituted or unsubstituted methyl group; a substituted or unsubstituted cyclohexyl group; a substituted or unsubstituted cyclopentyl group; a substituted or unsubstituted cycloheptyl group; a substituted or unsubstituted cyclooctyl group; a substituted or unsubstituted bicycloheptyl group; a substituted or unsubstituted bicyclooctyl group; a substituted or unsubstituted adamantane group; or a substituted or unsubstituted tetrahydropyran group.

According to an exemplary embodiment of the present specification, R1, R3, R5, and R7 are the same as or different from each other, and are each independently hydrogen; a methyl group; a cyclohexyl group unsubstituted or substituted with an alkyl group or an alkoxy group; a cyclopentyl group; a cycloheptyl group; a cyclooctyl group; a bicycloheptyl group unsubstituted or substituted with an aryl group; a bicyclooctyl group; an adamantane group; or a tetrahydropyran group.

According to an exemplary embodiment of the present specification, R1, R3, R5, and R7 are the same as or different from each other, and are each independently hydrogen; a methyl group; a cyclohexyl group unsubstituted or substituted with a methyl group, an ethyl group or a methoxy group; a cyclopentyl group; a cycloheptyl group; a cyclooctyl group; a bicycloheptyl group unsubstituted or substituted with a phenyl group; an adamantane group; or a tetrahydropyran group.

According to an exemplary embodiment of the present specification, when R1, R3, R5, and R7 are a cyclohexyl group, the compound becomes bulky, and as a result, the stability of the compound is enhanced, the case where R1, R3, R5, and R7 are a cyclohexyl group substituted with an alkyl group such as a methyl group and an ethyl group has a more enhanced stability of the compound, and thus has an excellent effect in terms of durability when used for a color conversion film.

According to an exemplary embodiment of the present specification, R2 is a cyano group; a nitro group; an ester group; an amide group; a sulfonyl group, or a fluoroalkyl group.

According to an exemplary embodiment of the present specification, R2 is —CN; —NO$_2$; —COOC$_2$H$_5$; —CON(CH$_3$)$_2$; —CONH(C$_2$H$_5$); —CF$_3$; —SO$_3$C$_2$H$_5$; or —COOCH$_2$CF$_2$CF$_2$CF$_3$.

According to an exemplary embodiment of the present specification, R2 is —CN; or —COOCH$_2$CF$_2$CF$_2$CF$_3$.

According to an exemplary embodiment of the present specification, R2 is a cyano group; or a fluoroalkyl group.

According to an exemplary embodiment of the present specification, R2 is a cyano group; or —CF$_3$.

According to an exemplary embodiment of the present specification, R2 is a cyano group.

According to an exemplary embodiment of the present specification, R6 is hydrogen or deuterium.

According to an exemplary embodiment of the present specification, R6 is hydrogen.

According to an exemplary embodiment of the present specification, X1 and X2 are the same as or different from each other, and are each —F, a nitro group, a cyano group, —CO$_2$CH$_3$, —OCOCH$_3$, —SO$_3$H, —CF$_3$, —OCH$_3$, or —OC$_6$H$_5$.

According to an exemplary embodiment of the present specification, X1 and X2 are the same as or different from each other, and are each F or CN.

According to an exemplary embodiment of the present specification, X1 and X2 are F or CN.

According to an exemplary embodiment of the present specification, R1, R3, R5, and R7 may be selected from 1A to 83A of the following Table 1, R2 and R6 may be selected from 1B to 8B of the following Table 2, R4 may be selected from 1C to 32C of the following Table 3, and X1 and X2 are selected from 1D to 10D of Table 4.

TABLE 1

| Combination | R1 | R3 | R5 | R7 |
|---|---|---|---|---|
| 1A | cyclohexyl | cyclohexyl | cyclohexyl | cyclohexyl |
| 2A | 2-methylcyclohexyl (wedge) | 2-methylcyclohexyl (wedge) | 2-methylcyclohexyl (wedge) | 2-methylcyclohexyl (wedge) |
| 3A | 2-methylcyclohexyl (dash) | 2-methylcyclohexyl (dash) | 2-methylcyclohexyl (dash) | 2-methylcyclohexyl (dash) |
| 4A | 2-methylcyclohexyl (wedge) | cyclohexyl | cyclohexyl | 2-methylcyclohexyl (wedge) |
| 5A | 2-methylcyclohexyl (dash) | cyclohexyl | cyclohexyl | 2-methylcyclohexyl (dash) |
| 6A | 2-methylcyclohexyl (wedge) | 2-methylcyclohexyl (wedge) | cyclohexyl | 2-methylcyclohexyl (wedge) |
| 7A | 2-methylcyclohexyl (dash) | 2-methylcyclohexyl (dash) | cyclohexyl | 2-methylcyclohexyl (dash) |

TABLE 1-continued

| Combination | R1 | R3 | R5 | R7 |
|---|---|---|---|---|
| 8A | cyclohexyl | cyclohexyl with CH₃ (wedge bond) | cyclohexyl | cyclohexyl with CH₃ (wedge bond) |
| 9A | cyclohexyl | cyclohexyl with CH₃ (dashed bond) | cyclohexyl | cyclohexyl with CH₃ (dashed bond) |
| 10A | cyclohexyl with CH₃ (wedge bond) | —CH₃ | —CH₃ | cyclohexyl with CH₃ (wedge bond) |
| 11A | cyclohexyl with CH₃ (dashed bond) | —CH₃ | —CH₃ | cyclohexyl with CH₃ (dashed bond) |
| 12A | cyclohexyl | —CH₃ | —CH₃ | cyclohexyl with CH₃ (wedge bond) |
| 13A | cyclohexyl | —CH₃ | —CH₃ | cyclohexyl with CH₃ (dashed bond) |
| 14A | cyclopentyl | cyclopentyl | cyclopentyl | cyclopentyl |
| 15A | cyclopentyl | cyclopentyl | cyclohexyl | cyclopentyl |

TABLE 1-continued
| Combination | R1 | R3 | R5 | R7 |
|---|---|---|---|---|
| 16A | 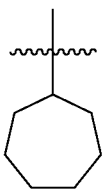 [SMILES: *C1CCCCCC1] | 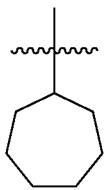 | 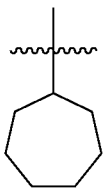 | 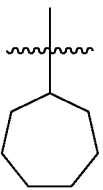 |
| 17A | 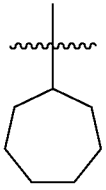 [SMILES: *C1CCCCCC1] | 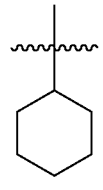 | 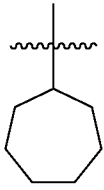 | 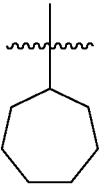 [SMILES: *C1CCCCCC1] |
| 18A | 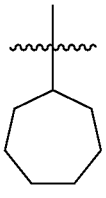 [SMILES: *C1CCCCCC1] | 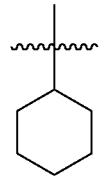 [SMILES: *C1CCCCC1] | 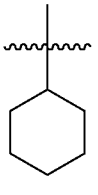 [SMILES: *C1CCCCC1] | 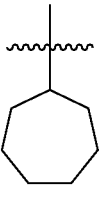 [SMILES: *C1CCCCCC1] |
| 19A | 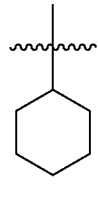 | 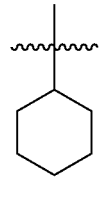 | 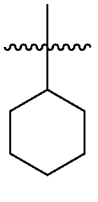 [SMILES: *C1CCCCC1] | 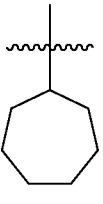 [SMILES: *C1CCCCCC1] |
| 20A | 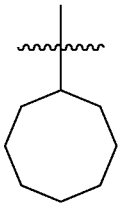 [SMILES: *C1CCCCCCC1] | 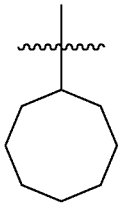 | 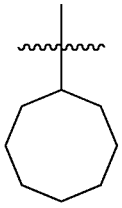 | 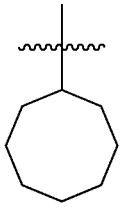 |
| 21A | 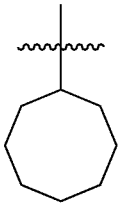 [SMILES: *C1CCCCCCC1] | 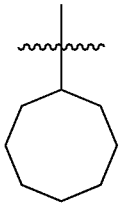 [SMILES: *C1CCCCCCC1] | 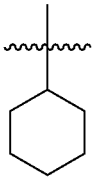 [SMILES: *C1CCCCC1] | 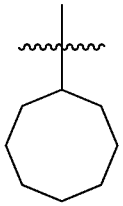 [SMILES: *C1CCCCCCC1] |
| 22A | 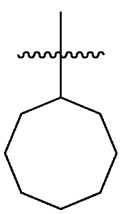 [SMILES: *C1CCCCCCC1] | 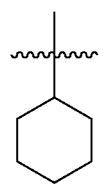 | 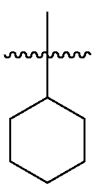 [SMILES: *C1CCCCC1] | 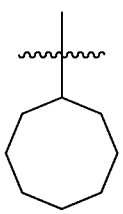 [SMILES: *C1CCCCCCC1] |

TABLE 1-continued

| Combination | R1 | R3 | R5 | R7 |
| --- | --- | --- | --- | --- |
| 23A | cyclohexyl | cyclohexyl | cyclohexyl | cyclooctyl |
| 24A | tetrahydropyran-4-yl | tetrahydropyran-4-yl | tetrahydropyran-4-yl | tetrahydropyran-4-yl |
| 25A | tetrahydropyran-4-yl | tetrahydropyran-4-yl | cyclohexyl | tetrahydropyran-4-yl |
| 26A | tetrahydropyran-4-yl | cyclohexyl | cyclohexyl | tetrahydropyran-4-yl |
| 27A | cyclohexyl | cyclohexyl | cyclohexyl | tetrahydropyran-4-yl |
| 28A | norbornyl | norbornyl | norbornyl | norbornyl |
| 29A | norbornyl | cyclohexyl | norbornyl | norbornyl |
| 30A | norbornyl | cyclohexyl | cyclohexyl | norbornyl |

TABLE 1-continued

| Combination | R1 | R3 | R5 | R7 |
|---|---|---|---|---|
| 31A | cyclohexyl | cyclohexyl | cyclohexyl | norbornyl |
| 32A | 2-methylcyclohexyl | cyclohexyl | cyclohexyl | norbornyl |
| 33A | 2-methylcyclohexyl | cycloheptyl | cyclohexyl | norbornyl |
| 34A | 3-phenylnorbornyl | 3-phenylnorbornyl | 3-phenylnorbornyl | 3-phenylnorbornyl |
| 35A | 3-phenylnorbornyl | cyclohexyl | cyclohexyl | 3-phenylnorbornyl |
| 36A | adamantyl | cyclohexyl | cyclohexyl | adamantyl |
| 37A | cyclohexyl | cyclohexyl | cyclohexyl | adamantyl |

TABLE 1-continued

| Combination | R1 | R3 | R5 | R7 |
|---|---|---|---|---|
| 38A | adamantyl | —CH₃ | —CH₃ | adamantyl |
| 39A | adamantyl | —CH₃ | cyclohexyl | adamantyl |
| 40A | 2-OCH₃-cyclohexyl | 2-OCH₃-cyclohexyl | 2-OCH₃-cyclohexyl | 2-OCH₃-cyclohexyl |
| 41A | 2-OCH₃-cyclohexyl | 2-OCH₃-cyclohexyl | 2-OCH₃-cyclohexyl | 2-OCH₃-cyclohexyl |
| 42A | 2-OCH₃-cyclohexyl | 2-OCH₃-cyclohexyl | cyclohexyl | 2-OCH₃-cyclohexyl |
| 43A | 2-OCH₃-cyclohexyl | 2-OCH₃-cyclohexyl | cyclohexyl | 2-OCH₃-cyclohexyl |
| 44A | 2-OCH₃-cyclohexyl | cyclohexyl | cyclohexyl | 2-OCH₃-cyclohexyl |
| 45A | 2-OCH₃-cyclohexyl | cyclohexyl | cyclohexyl | 2-OCH₃-cyclohexyl |

TABLE 1-continued

| Combination | R1 | R3 | R5 | R7 |
|---|---|---|---|---|
| 46A | cyclohexyl | cyclohexyl | cyclohexyl | cyclohexyl-OCH₃ |
| 47A | cyclohexyl | cyclohexyl | cyclohexyl | cyclohexyl-OCH₃ |
| 48A | cyclohexyl | cyclohexyl-OCH₃ | cyclohexyl | cyclohexyl-OCH₃ |
| 49A | cyclohexyl | cyclohexyl-OCH₃ | cyclohexyl | cyclohexyl-OCH₃ |
| 50A | cyclohexyl-CH₃ | cyclohexyl-OCH₃ | cyclohexyl-OCH₃ | cyclohexyl-CH₃ |
| 51A | cyclohexyl-CH₃ | cyclohexyl-OCH₃ | cyclohexyl-OCH₃ | cyclohexyl-CH₃ |
| 52A | cyclohexyl-CH₃ | cyclohexyl-OCH₃ | cyclohexyl | cyclohexyl-CH₃ |
| 53A | cyclohexyl-CH₃ | cyclohexyl-OCH₃ | cyclohexyl | cyclohexyl-CH₃ |

TABLE 1-continued
| Combination | R1 | R3 | R5 | R7 |
|---|---|---|---|---|
| 54A | 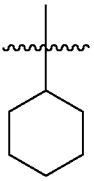 | 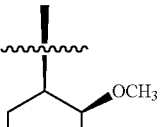 | 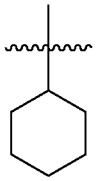 [SMILES: *C1CCCCC1] | 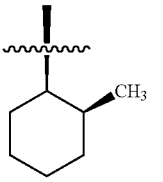 |
| 55A | 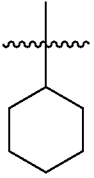 | 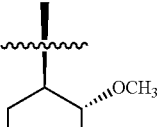 | 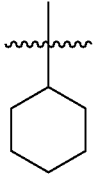 | 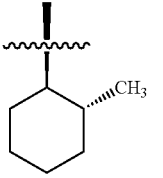 |
| 58A | 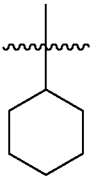 | —H | —H | 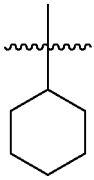 |
| 59A | 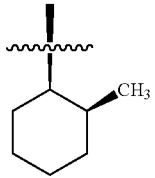 | —H | —H | 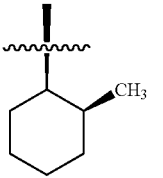 |
| 60A | 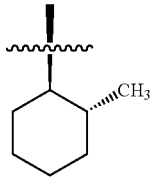 | —H | —H | 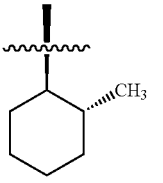 |
| 61A | 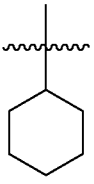 | —H | —H | 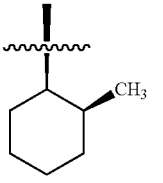 |
| 62A | 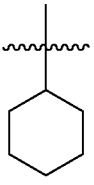 | —H | —H | 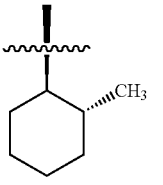 |
| 63A | 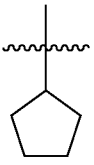 [SMILES: *C1CCCC1] | —H | —H | 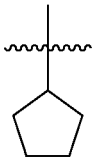 [SMILES: *C1CCCC1] |

TABLE 1-continued
| Combination | R1 | R3 | R5 | R7 |
|---|---|---|---|---|
| 64A | 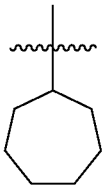 [SMILES: *C1CCCCCC1] | —H | —H | 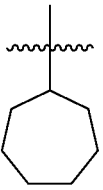 [SMILES: *C1CCCCCC1] |
| 65A | 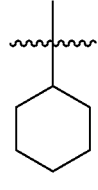 | —H | —H | 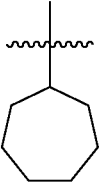 [SMILES: *C1CCCCCC1] |
| 66A | 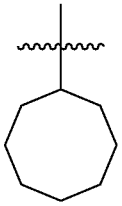 [SMILES: *C1CCCCCCC1] | —H | —H | 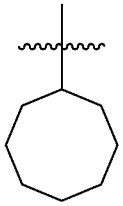 [SMILES: *C1CCCCCCC1] |
| 67A | 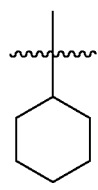 | —H | —H | 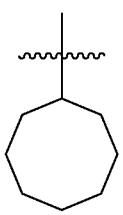 [SMILES: *C1CCCCCCC1] |
| 68A | 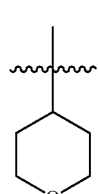 | —H | —H | 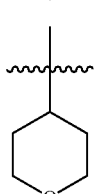 |
| 69A | 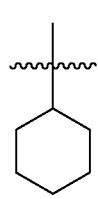 | —H | —H | 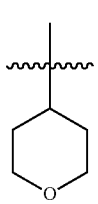 |
| 70A | 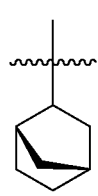 | —H | —H | 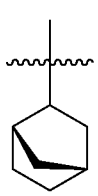 |
| 71A | 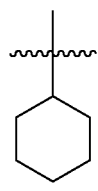 | —H | —H | 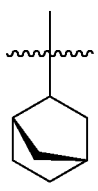 |

TABLE 1-continued

| Combination | R1 | R3 | R5 | R7 |
|---|---|---|---|---|
| 72A | 2-methylcyclohexyl | —H | —H | norbornyl |
| 73A | 3-phenylnorbornyl | —H | —H | 3-phenylnorbornyl |
| 74A | 1-adamantyl | —H | —H | 1-adamantyl |
| 75A | cyclohexyl | —H | —H | 1-adamantyl |
| 76A | 2-methoxycyclohexyl | —H | —H | 2-methoxycyclohexyl |
| 77A | 2-methoxycyclohexyl | —H | —H | 2-methoxycyclohexyl |
| 78A | cyclohexyl | —H | —H | 2-methoxycyclohexyl |
| 79A | cyclohexyl | —H | —H | 2-methoxycyclohexyl |

TABLE 1-continued

| Combination | R1 | R3 | R5 | R7 |
|---|---|---|---|---|
| 80A | cis-2,6-dimethylcyclohexyl | —H | —H | cis-2,6-dimethylcyclohexyl |
| 81A | trans-2,6-dimethylcyclohexyl | —H | —H | trans-2,6-dimethylcyclohexyl |
| 82A | tetrahydropyran-4-yl | tetrahydropyran-4-yl | tetrahydropyran-4-yl | tetrahydropyran-4-yl |
| 83A | 2-ethylcyclohexyl | 2-ethylcyclohexyl | 2-ethylcyclohexyl | 2-ethylcyclohexyl |

TABLE 2

| Combination | R2 | R6 |
|---|---|---|
| 1B | —CN | —H |
| 2B | —COOC$_2$H$_5$ | —H |
| 3B | —CON(CH$_3$)$_2$ | —H |
| 4B | —CONH(C$_2$H$_5$) | H |
| 5B | —CF$_3$ | —H |
| 6B | —SO$_3$C$_2$H$_5$ | —H |
| 7B | —NO$_2$ | —H |
| 8B | —C(=O)OCH$_2$CF$_2$CF$_2$CF$_2$F (with methyl branch) | —H |

TABLE 3

| Combination | R4 |
|---|---|
| 1C | —H |
| 2C | —Me |
| 3C | cyclohexyl |
| 4C | phenyl |
| 5C | 4-cyanophenyl |
| 6C | 3-cyanophenyl |

TABLE 3-continued
| Combination | R4 |
|---|---|
| 7C | 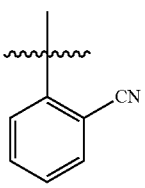 [SMILES: *c1ccccc1C#N] |
| 8C | 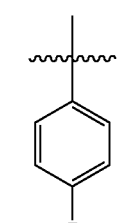 |
| 9C | 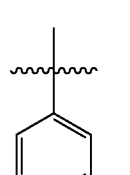 |
| 10C | 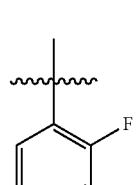 |
| 11C | 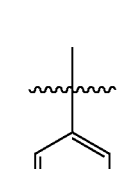 |
| 12C | 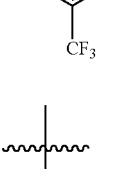 |
| 13C | 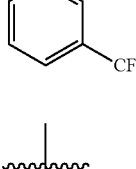 |
| 14C | 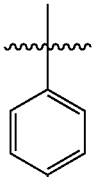 |
| 15C | 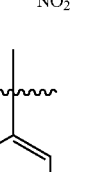 |
| 16C |  |
| 17C | 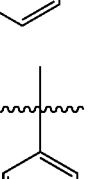 |
| 18C | 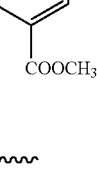 |
| 19C | 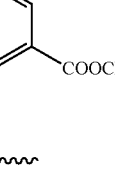 |
| 20C | 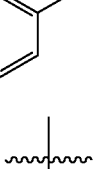 |

TABLE 3-continued

| Combination | R4 |
|---|---|
| 21C | 3-methoxyphenyl |
| 22C | 2-methoxyphenyl |
| 23C | 4-methylphenyl |
| 24C | 3-methylphenyl |
| 25C | 2-methylphenyl |
| 26C | 4-isopropylphenyl |
| 27C | 3-isopropylphenyl |
| 28C | 2-isopropylphenyl |
| 29C | 3,5-dimethylphenyl |
| 30c | 3,4,5-trimethylphenyl |
| 31C | 3,5-diphenylphenyl |
| 32C | 2,6-diphenylphenyl |

TABLE 4

| Combination | X1 | X2 |
|---|---|---|
| 1D | —F | —F |
| 2D | —CN | —CN |
| 3D | —F | —CN |
| 4D | —NO$_2$ | —NO$_2$ |
| 5D | —CO$_2$CH$_3$ | —CO$_2$CH$_3$ |
| 6D | —OCOCH$_3$ | —OCOCH$_3$ |
| 7D | —CF$_3$ | —CF$_3$ |
| 8D | —SO$_3$C$_2$H$_5$ | —SO$_3$C$_2$H$_5$ |
| 9D | —OCH$_3$ | —OCH$_3$ |
| 10D | —OC$_6$H$_5$ | —OC$_6$H$_5$ |

According to an exemplary embodiment of the present specification, the compound of Chemical Formula 1 is a compound having a substituent of 2A or 3A of Table 1, 1B or 2B of Table 2, any one of 1C, 2C, and 3C of Table 3, and 1D of Table 4.

According to an exemplary embodiment of the present specification, the compound of Chemical Formula 1 is a compound having a substituent of 2A, 1B, 1C, and 1D.

According to an exemplary embodiment of the present specification, the compound of Chemical Formula 1 is a compound having a substituent of 2A, 1B, 2C, and 1D.

According to an exemplary embodiment of the present specification, the compound of Chemical Formula 1 is a compound having a substituent of 2A, 1B, 3C, and 1D.

According to an exemplary embodiment of the present specification, the compound of Chemical Formula 1 is a compound having a substituent of 2A, 1B, 1C, and 2D.

According to an exemplary embodiment of the present specification, the compound of Chemical Formula 1 is a compound having a substituent of 2A, 1B, 2C, and 2D.

According to an exemplary embodiment of the present specification, the compound of Chemical Formula 1 is a compound having a substituent of 2A, 1B, 3C, and 2D.

According to an exemplary embodiment of the present specification, the compound of Chemical Formula 1 is a compound having a substituent of 3A, 1B, 1C, and 1D.

According to an exemplary embodiment of the present specification, the compound of Chemical Formula 1 is a compound having a substituent of 3A, 1B, 2C, and 1D.

According to an exemplary embodiment of the present specification, the compound of Chemical Formula 1 is a compound having a substituent of 3A, 1B, 3C, and 1D.

According to an exemplary embodiment of the present specification, the compound of Chemical Formula 1 is a compound having a substituent of 3A, 1B, 1C, and 2D.

According to an exemplary embodiment of the present specification, the compound of Chemical Formula 1 is a compound having a substituent of 3A, 1B, 2C, and 2D.

According to an exemplary embodiment of the present specification, the compound of Chemical Formula 1 is a compound having a substituent of 3A, 1B, 3C, and 2D.

According to an exemplary embodiment of the present specification, the compound of Chemical Formula 1 has a maximum absorption peak which is 1 nm to 30 nm lower than that of a compound in which R1, R3 to R5, R7, X1, and X2 are the same as each other, except that R6 is the same as R2. Specifically, the compound of the present invention in which R2 is a cyano group and R6 is hydrogen has a maximum absorption peak which is 1 nm to 30 nm lower than that of a compound in which both R2 and R6 are a cyano group, and R1, R3 to R5, R7, X1, and X2 are the same as each other.

According to an exemplary embodiment of the present specification, the compound of Chemical Formula 1 has a maximum absorption peak which is 1 nm to 30 nm lower than that of a compound in which R1, R3 to R5, R7, X1, and X2 are the same as each other, except that R6 is the same as R2. Specifically, the compound of the present invention in which R2 is a cyano group and R6 is hydrogen has a maximum light emission peak which is 1 nm to 30 nm lower than that of a compound in which both R2 and R6 are a cyano group, and R1, R3 to R5, R7, X1, and X2 are the same as each other.

An exemplary embodiment of the present specification provides a color conversion film including: a resin matrix; and the compound represented by Chemical Formula 1, which is dispersed in the resin matrix.

The content of the compound represented by Chemical Formula 1 in the color conversion film may be within a range of 0.001 to 10 wt %.

The color conversion film may also include one or two or more of the compounds represented by Chemical Formula 1.

The color conversion film may further include an additional fluorescent material in addition to the compound represented by Chemical Formula 1. When a light source which emits blue light is used, it is preferred that the color conversion film includes both a fluorescent material which emits green light and a fluorescent material which emits red light. Further, when a light source which emits blue light and green light is used, the color conversion film may include only a fluorescent material which emits red light. However, the color conversion film is not limited thereto, and even when a light source which emits blue light is used, the color conversion film may include only a compound which emits red light in the case where a separate film including a fluorescent material which emits green light is stacked. Conversely, even when a light source which emits blue light is used, the color conversion film may include only a compound which emits green light in the case where a separate film including a fluorescent material which emits red light is stacked.

The color conversion film may further include a resin matrix; and an additional layer including a compound which is dispersed in the resin matrix and emits light having a wavelength different from that of the compound represented by Chemical Formula 1. The compound which emits light having a wavelength different from that of the compound represented by Chemical Formula 1 may also be the compound expressed as Chemical Formula 1, and may also be another publicly-known fluorescent material.

It is preferred that a material for the resin matrix is a thermoplastic polymer or a thermosetting polymer. Specifically, as the material for the resin matrix, it is possible to use a poly(meth)acrylic material such as polymethylmethacrylate (PMMA), a polycarbonate (PC)-based material, a polystyrene (PS)-based material, a polyarylene (PAR)-based material, a polyurethane (TPU)-based material, a styrene-acrylonitrile (SAN)-based material, a polyvinylidenefluoride (PVDF)-based material, a modified-polyvinylidenefluoride (modified-PVDF)-based material, and the like.

According to an exemplary embodiment of the present specification, the color conversion film according to the above-described exemplary embodiment additionally includes light diffusion particles. By dispersing light diffusion particles in the color conversion film instead of a light diffusion film used in the related art in order to improve brightness, an attaching process may be omitted, and higher brightness may be exhibited as compared to the case where a separate light diffusion film is used.

As the light diffusion particle, particles having a high refractive index with a resin matrix may be used, and it is possible to use, for example, $TiO_2$, silica, borosilicate, alumina, sapphire, air or another gas, air- or gas-filled hollow beads or particles (for example, air/gas-filled glass or polymer); polymer particles including polystyrene, polycarbonate, polymethylmethacrylate, acryl, methyl methacrylate, styrene, a melamine resin, a formaldehyde resin, or a melamine and formaldehyde resin, or any suitable combination thereof.

The particle diameter of the light diffusion particle may be within a range of 0.1 μm to 5 μm, for example, within a range of 0.3 μm to 1 μm. The content of the light diffusion particle may be determined, if necessary, and may be, for example, within a range of about 1 to 30 parts by weight based on 100 parts by weight of the resin matrix.

The color conversion film according to the above-described exemplary embodiment may have a thickness of 2 μm to 200 μm. In particular, the color conversion film may exhibit high brightness even in a small thickness of 2 μm to 20 μm. This is because the content of the fluorescent material molecule included in a unit volume is higher than that of a quantum dot.

In the color conversion film according to the above-described exemplary embodiment, a substrate may be provided on one surface of the color conversion film. The substrate may function as a support when preparing the color conversion film. The kind of substrate is not particularly limited, and the material or thickness of the substrate is not limited as long as the substrate is transparent and may function as the support. Here, transparency means that the transmittance of visible light is 70% or more. For example, as the substrate, a PET film may be used.

The above-described color conversion film may be prepared by coating a resin solution, in which the above-described compound represented by Chemical Formula 1 is dissolved, on a substrate and drying the resin solution, or extruding the above-described compound represented by Chemical Formula 1 together with the resin to produce a film.

Since the above-described compound represented by Chemical Formula 1 is dissolved in the resin solution, the compound represented by Chemical Formula 1 is uniformly distributed in the solution. This is different from a process of preparing a quantum dot film, which requires a separate dispersing process.

The preparation method of the resin solution in which the compound represented by Chemical Formula 1 is dissolved is not particularly limited as long as the above-described compound represented by Chemical Formula 1 is present in a state where the resin is dissolved in the solution.

According to an example, the resin solution in which the compound represented by Chemical Formula 1 is dissolved may be prepared by a method including: dissolving the compound represented by Chemical Formula 1 in a solvent to prepare a first solution, dissolving a resin in a solvent to prepare a second solution, and mixing the first solution with the second solution. When the first solution and the second solution are mixed, it is preferred to uniformly mix the solutions. However, the method is not limited thereto, and it is possible to use a method of simultaneously adding a compound represented by Chemical Formula 1 and a resin to a solvent to dissolve the compound and the resin, a method of dissolving the compound represented by Chemical Formula 1 in a solvent, and subsequently adding the resin thereto to dissolve the resin, a method of dissolving the resin in a solvent, and subsequently adding the compound represented by Chemical Formula 1 thereto to dissolve the compound, and the like.

As the resin included in the solution, it is possible to use the above-described resin matrix material, a monomer which is curable by the resin matrix resin, or a mixture thereof. Examples of the monomer which is curable by the resin matrix resin include a (meth)acrylic monomer, and the monomer may be formed as a resin matrix material by UV curing. When a curable monomer is used as described above, an initiator required for curing may be further added, if necessary.

The solvent is not particularly limited, and is not particularly limited as long as the solvent may be removed by a subsequent drying while not adversely affecting the coating process. As a non-limiting example of the solvent, it is possible to use toluene, xylene, acetone, chloroform, various alcohol-based solvents, methyl ethyl ketone (MEK), methyl isobutyl ketone (MIBK), ethyl acetate (EA), butyl acetate, dimethylformamide (DMF), dimethylacetamide (DMAc), dimethylsulfoxide (DMSO), N-methyl-pyrrolidone (NMP), and the like, and one or a mixture of two or more thereof may be used. When the first solution and the second solution are used, the solvents included in each of the solutions may also be the same as or different from each other. Even when different solvents are used in the first solution and the second solution, it is preferred that these solvents have compatibility so as to be mixed with each other.

For the process of coating the resin solution, in which the compound represented by Chemical Formula 1 is dissolved, on a substrate, a roll-to-roll process may be used. For example, the process may be performed by a process of unwinding a substrate from a roll on which the substrate is wound, coating the resin solution, in which the compound represented by Chemical Formula 1 is dissolved, on one surface of the substrate, drying the resin solution, and then winding the substrate again on the roll. When the roll-to-roll process is used, it is preferred that the viscosity of the resin solution is determined within a range in which the process may be implemented, and the viscosity may be determined within a range of, for example, 200 to 2,000 cps.

As the coating method, various publicly-known methods may be used, and for example, a die coater may also be used, and various bar-coating methods such as a comma coater and a reverse comma coater may also be used.

After the coating, a drying process is performed. The drying process may be performed under conditions required for removing the solvent. For example, it is possible to obtain a color conversion film including a fluorescent material including the compound represented by Chemical Formula 1, which has desired thickness and concentration, on a substrate by carrying out the drying in an oven located close to a coater under a condition to sufficiently evaporate a solvent, in a direction in which the substrate progresses during the coating process.

When the monomer which is curable by the resin matrix resin is used as a resin included in the solution, curing, for example, UV curing may be performed before the drying or simultaneously with the drying.

When the compound represented by Chemical Formula 1 is filmed by being extruded with a resin, an extrusion method known in the art may be used, and for example, a color conversion film may be prepared by extruding the compound represented by Chemical Formula 1 with a resin such as a polycarbonate (PC)-based resin, a poly(meth)acrylic resin, and a styrene-acrylonitrile (SAN)-based resin.

According to an exemplary embodiment of the present specification, a protective film or a barrier film may be provided on at least one surface of the color conversion film. As the protective film and the barrier film, films known in the art may be used.

An exemplary embodiment of the present specification provides a backlight unit including the above-described color conversion film. The backlight unit may have a backlight unit configuration known in the art, except that the backlight unit includes the color conversion film. FIG. 1 illustrates a schematic view of a backlight unit structure according to an example. The backlight unit according to FIG. 1 includes a side chain-type light source 101, a reflective plate 102 which surrounds the light source, a light guide plate 103 which guides light directly emitted from the light source, or reflected from the reflective plate, a reflective layer 104 which is provided on one surface of the light guide plate, and a color conversion film 105 which is provided on a surface opposite to a surface facing the reflective layer of the light guide plate. A part indicated as 106 in FIG. 1 is a light dispersion pattern 106 of the light guide plate. The light incident inside the light guide plate has an irregular light distribution due to the repetition of an optical process such as reflection, total reflection, refraction, and transmission, and a 2-dimensional light dispersion pattern may be used in order to guide the irregular light distribution to have a uniform brightness. However, the scope of the present invention is not limited by FIG. 1, and not only a side chain-type light source but also a direct-type light source may also be used as the light source, and the reflective plate or the reflective layer may be omitted or may also be replaced with another configuration, if necessary, and an additional film, for example, a light diffusion film, a light collecting film, a brightness enhancement film, and the like may be further provided, if necessary.

An exemplary embodiment of the present specification provides a display apparatus including the backlight unit. The display apparatus is not particularly limited as long as the apparatus is a display apparatus including a backlight unit, and may be included in a TV, a monitor of a computer, a laptop computer, a mobile phone, and the like.

Hereinafter, the present specification will be described in detail with reference to Examples for specifically describing the present specification. However, the Examples according to the present specification may be modified in various forms, and it is not interpreted that the scope of the present application is limited to the Examples described in detail below. The Examples of the present application are provided for more completely explaining the present specification to the person with ordinary skill in the art.

Comparative Example 1

<Compound A>

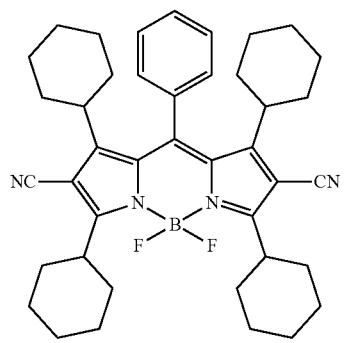

[Preparation Method A]

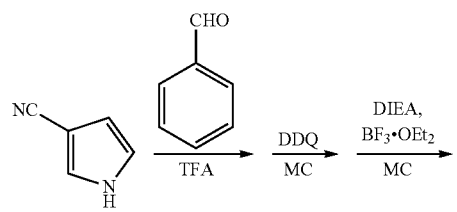

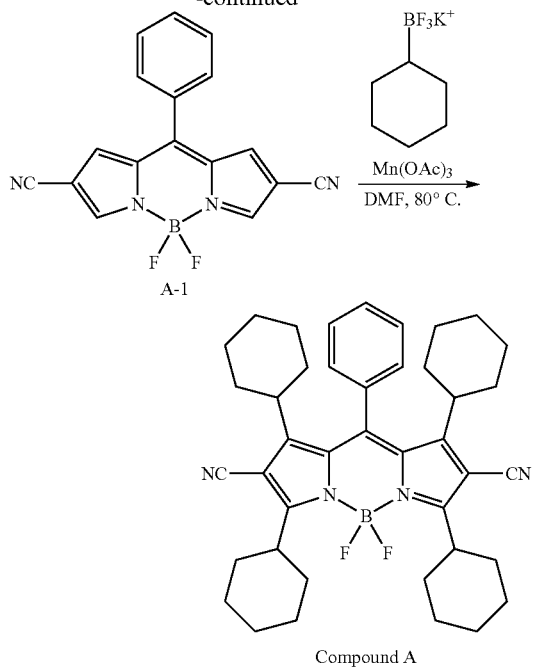

<Preparation of A-1>

After methyl 1H-pyrrole-3-carbonitrile (2 g, 23.8 mmol) was dissolved in dichloromethane, benzaldehyde (1.2 g, 11.9 mmol) was added thereto, the resulting mixture was stirred for about 15 minutes, one or two drops of trifluoroacetic acid were added thereto, and then the resulting mixture was stirred at room temperature for 12 hours. Thereafter, 2,3-dichloro-5,6-dicyano-p-benzoquinone (2.7 g, 11.9 mmol) was added thereto, and then the resulting mixture was additionally stirred for 15 minutes. N,N-diisopropylethylamine (DIEA) (21.5 g, 166 mmol) was added to the stirred mixture, and then a boron trifluoride-ethyl ether complex (25 g, 178 mmol) was slowly added thereto, and the resulting mixture was additionally stirred for 5 hours. After the stirring was completed, the reaction was terminated with water, the organic layer was extracted using dichloromethane, the extracted material was concentrated, and Intermediate A-1 was synthesized using column chromatography. $[M-F]^+=299$ <Preparation of Compound A>

After A-1 (0.76 g, 2.4 mmol) was dissolved in dimethylformamide, potassium cyclohexyltrifluoroborate (2 g, 10.8 mmol) and $Mn(OAc)_3$ (7 g, 26.4 mmol) were added thereto, the resulting mixture was stirred at 80° C. for 1 hour, and then the reaction was terminated. The organic layer was extracted using water and ethyl acetate, the extracted material was concentrated, and [Compound A] was secured using column chromatography. $[M-F]^+=627$ $^1$H NMR (500 MHz, $CDCl_3$) δ 7.67 (d, J=7.6 Hz, 1H), 7.55 (t, J=7.8 Hz, 2H), 7.36 (dd, J=8.1, 1.1 Hz, 2H), 3.47 (dd, J=16.6, 7.4 Hz, 2H), 1.98 (dd, J=21.6, 11.9 Hz, 4H), 1.90 (d, J=11.3 Hz, 8H), 1.75 (dt, J=12.9, 7.4 Hz, 6H), 1.58 (d, J=13.3 Hz, 4H), 1.54-1.36 (m, 8H), 1.33-1.23 (m, 6H), 1.13 (qd, J=13.2, 9.7 Hz, 2H), 0.48 (dt, J=13.0, 8.1 Hz, 4H)

Method for Preparing Film Using [Compound A]

The prepared [Compound A] was used for preparing a green light emitting color conversion film. Specifically, [Compound A] being a green light emitting material was added thereto at a ratio of 0.3 wt % compared to 100 wt % of a SAN polymer, diffuser particles were put thereinto at a ratio of 3 wt %, and coating was performed on a PET film using a solution having a solid content level of 30% in a normal-butyl acetate solvent, thereby preparing a green light emitting color conversion film. A blue LED light source was used from the prepared green color conversion film, thereby preparing a backlight unit with a size of 160 mm×90 mm. From the prepared backlight unit, optical properties were confirmed.

Comparative Example 2

[Compound B]

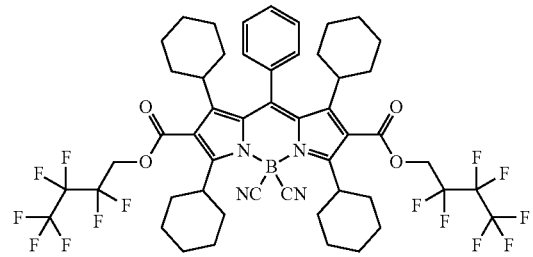

[Preparation Method B]

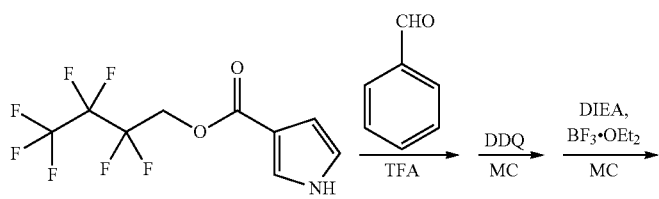

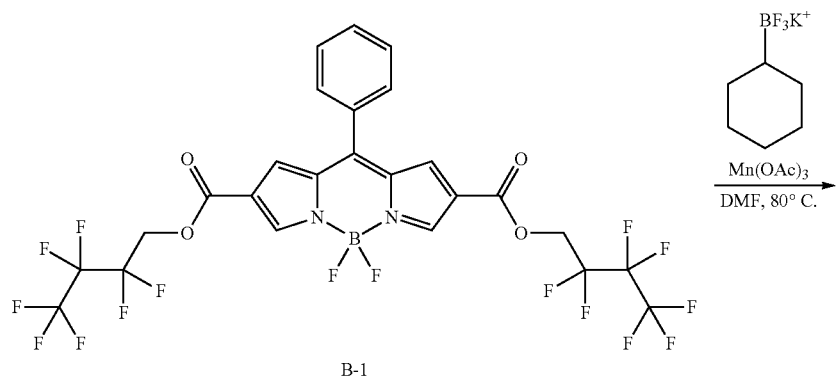

B-1

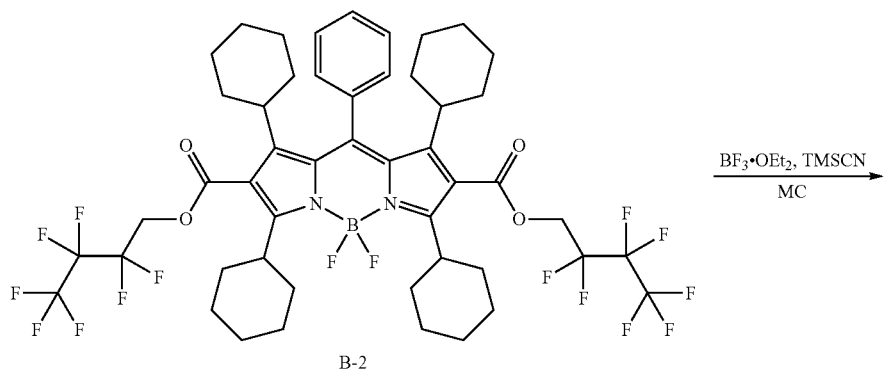

B-2

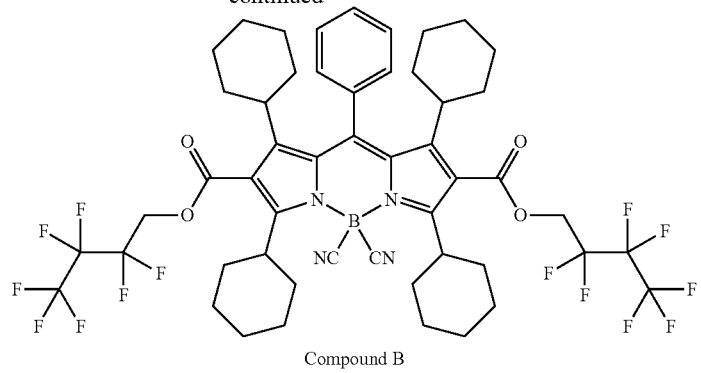

Compound B

<Preparation of B-1>

B-1 was prepared in the same manner as in Preparation Method A, except that 2,2,3,3,4,4,4-heptafluorobutyl-1H-pyrrole-3-carboxylate was used instead of methyl 1H-pyrrole-3-carbonitrile which produces A-1. [M−F]$^+$=701

<Preparation of B-2>

B-2 was prepared using B-1, except that A-1 was used when Compound A was prepared in Preparation Method A. [M−F]$^+$=1029

<Preparation of Compound B>

B-2 (0.15 g, 0.14 mmol) was dissolved in a methylene chloride solution, and then boron trifluoride ethyl ether (0.03 g, 0.28 mmol) was added dropwise thereto at 0° C. After the resulting mixture was stirred at room temperature for 3 hours, trimethylsilyl cyanide (TMSCN) (0.14 g, 1.4 mmol) was added dropwise thereto, and then the resulting mixture was stirred at room temperature for 5 hours. After the reaction was terminated, a saturated NaHCO$_3$ solution was added thereto, and then an extraction was performed with chloroform. After the extract was filtered with anhydrous magnesium sulfate, the solvent was removed by distillation under reduced pressure, and then Compound B was secured through silica gel column chromatography.

[M+H]$^+$=1063

$^1$H NMR (500 MHz, cdcl$_3$) δ 7.65 (d, J=7.3 Hz, 1H), 7.63-7.65 (m, 2H), 7.47 (dd, J=12.4, 7.6 Hz, 2H), 4.82 (d, J=14.0 Hz, 2H), 4.54 (d, J=13.2 Hz, 2H), 2.00 (d, J=10.9 Hz, 2H), 1.79-1.74 (m, 7H), 1.68-1.10 (m, 28H), 1.08-0.92 (m, 2H), 0.42-0.30 (m, 2H), 0.22-0.19 (m, 1H).

Method for Preparing Film Using [Compound B]

The prepared [Compound B] was used for preparing a green light emitting color conversion film. Specifically, [Compound B] being a green light emitting material was added thereto at a ratio of 0.3 wt % compared to 100 wt % of a SAN polymer, diffuser particles were put thereinto at a ratio of 3 wt %, and coating was performed on a PET film using a solution having a solid content level of 30% in a normal-butyl acetate solvent, thereby preparing a green light emitting color conversion film. A blue LED light source was used from the prepared green color conversion film, thereby preparing a backlight unit with a size of 160 mm×90 mm. From the prepared backlight unit, optical properties were confirmed.

Comparative Example 3

[Compound C]

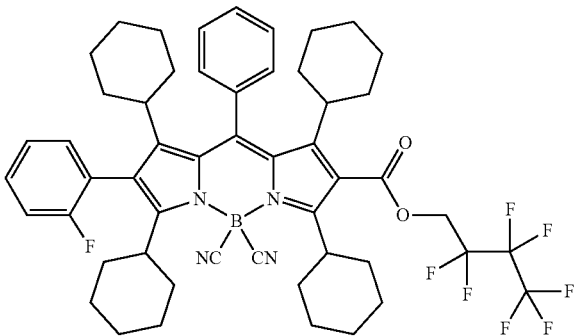

[Preparation Method C]

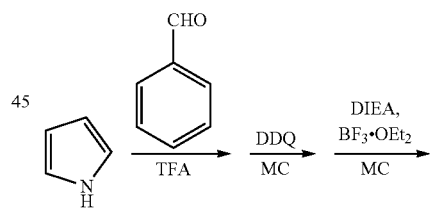

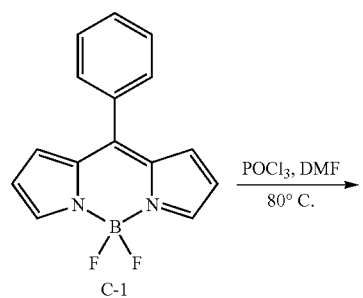

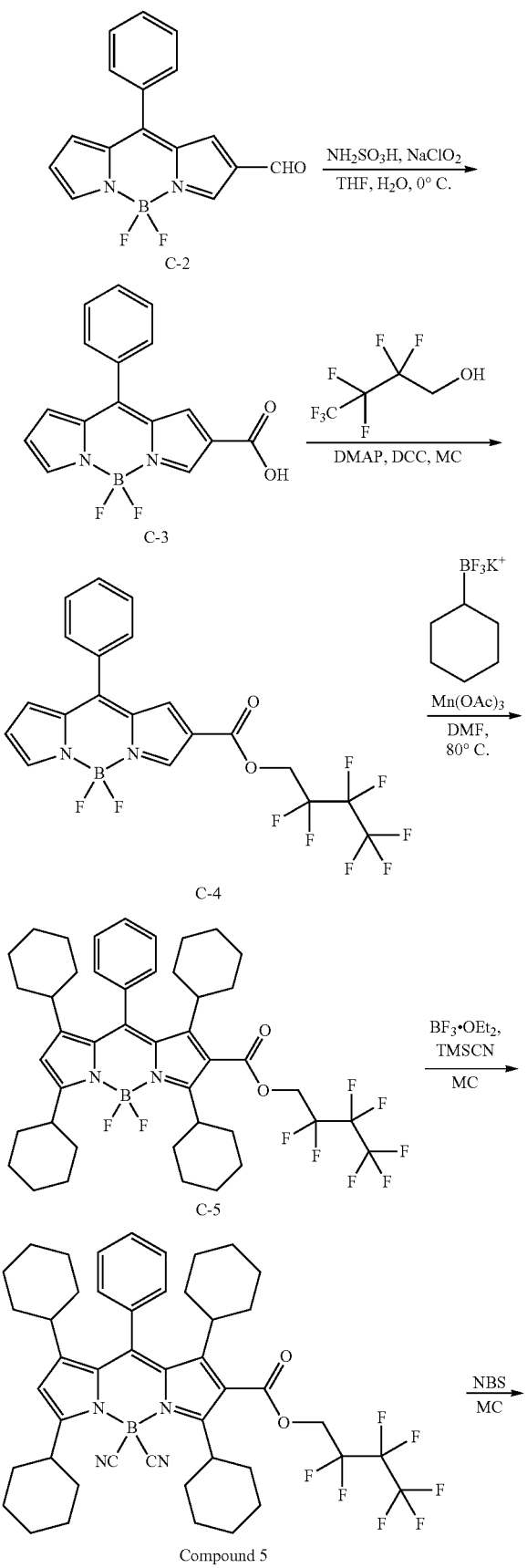
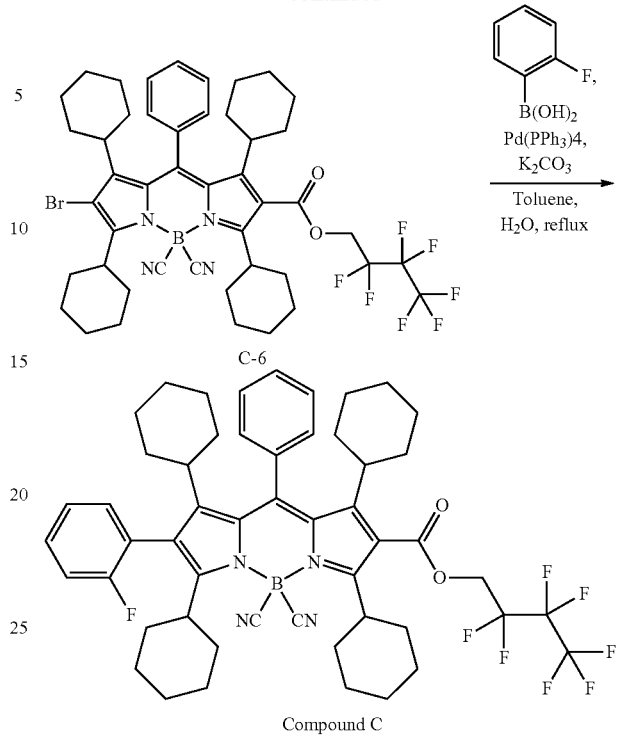

<Preparation of C-1>

C-1 was secured by performing the preparation in the same manner as in the preparation of Compound A-1 of Preparation Method A, except that pyrrole was used instead of methyl 1H-pyrrole-3-carbonitrile. [M−F]⁺=249

<Preparation of C-2>

After 10 mL of dimethylformamide was mixed with dichloroethane, 10 mL of POCl₃ was slowly introduced thereinto at 0° C., the resulting mixture was stirred at room temperature for 1 hour, and then Compound C-1 (2 g, 7.5 mmol) was added thereto, and the resulting mixture was warmed to 60° C. The mixture was stirred for 1 hour, and then the reaction was terminated. After the product was neutralized with a saturated aqueous sodium hydroxide solution, the organic layer was extracted with dichloromethane, dried over anhydrous magnesium sulfate, and then filtered, and concentrated, and then Compound C-2 was secured through column chromatography. [M−F]⁺=277

<Preparation of C-3>

C-2 (1.7 g, 5.7 mmol) was dissolved in THF, and then NH₂SO₃H (0.5 g, 5.7 mmol) was added thereto, and the resulting mixture was stirred. Thereafter, NaClO₄ (0.5 g, 5.7 mmol) dissolved in water was slowly added dropwise thereto at 0° C. After the mixture was stirred for 2 hours, the organic layer was extracted using a saturated sodium thiosulfate solution and a dichloromethane solution, dried over anhydrous magnesium sulfate, and then concentrated to secure Compound C-3. [M−F]⁺=293

<Preparation of C-4>

After C-3 (1.4 g, 4.6 mmol), 2,2,3,3,4,4-hetafluorobutanol (1.2 g, 6 mmol), and 4-dimethylaminopyridine (0.05 g, 0.46 mmol) were dissolved in dichloromethane, N,N'-dicyclohexylcarbodiimide (0.95 g, 4.6 mmol) dissolved in water was slowly added thereto at 0° C., and then the resulting mixture was stirred. The mixture was stirred at room temperature for 12 hours, and then the organic layer was extracted using a saturated sodium hydroxide solution and a dichloromethane solution. The extracted organic layer was dried over anhydrous magnesium sulfate and then concentrated, and then C-4 was secured using silica gel column chromatography. [M−F]$^+$=475

<Preparation of C-5>

After C-4 (1.8 g, 3.6 mmol) was dissolved in dimethylformamide, potassium cyclohexyltrifluoroborate (3.0 g, 16.2 mmol) and Mn(OAc)$_3$ (10.6 g, 39.6 mmol) were added thereto, the resulting mixture was stirred at 80° C. for 1 hour, and then the reaction was terminated. The organic layer was extracted using water and ethyl acetate, the extracted material was concentrated, and C-5 was secured using column chromatography. [M−F]$^+$=803

<Preparation of Compound 5>

The preparation method was the same as the method for preparing Compound B, and C-5 was used instead of B-2. Compound 5 was prepared using the corresponding method. [M+H]$^+$=837

<Preparation of C-6>

Compound 5 (1.1 g, 1.4 mmol) and N-bromosuccinimide (NBS) (0.3 g, 1.7 mmol) were dissolved in methylene chloride, and then the resulting mixture was stirred for 4 hours. After the mixture was cooled to room temperature, the organic layer was extracted using water and chloroform. The extracted organic layer was dried over anhydrous magnesium sulfate and then concentrated, and then C-6 was secured using silica gel column chromatography. [M+H]$^+$=916

<Compound C>

C-6 (1 g, 1.1 mmol) and 1-fluorophenyl boronic acid (0.18 g, 1.3 mmol) were dissolved in toluene, and then potassium carbonate (0.4 g, 3.3 mmol) dissolved in water was added thereto. The resulting mixture was sufficiently stirred, and then tetrakis(triphenylphosphine)palladium (0.06 g, 0.05 mmol) was added thereto. The resulting mixture was stirred for 24 hours, and then the organic layer was extracted using water and chloroform. The extracted organic layer was dried over anhydrous magnesium sulfate and then concentrated, and then Compound C was secured using silica gel column chromatography.

[M+H]$^+$=931

$^1$H NMR (500 MHz, cdcl$_3$) δ7.82-7.36 (m, 9H), 6.32 (s, 1H), 4.79 (d, J=14.0 Hz, 1H), 4.21 (d, J=13 Hz, 1H), 2.42 (d, J=10 Hz, 2H), 1.78-1.74 (m, 7H), 1.52-1.07 (m, 28H), 1.00-0.82 (m, 2H), 0.40-0.30 (m, 2H), 0.18-0.15 (m, 1H).

Method for Preparing Film Using [Compound C]

The prepared [Compound C] was used for preparing a green light emitting color conversion film. Specifically, [Compound C] being a green light emitting material was added thereto at a ratio of 0.4 wt % compared to 100 wt % of a SAN polymer, diffuser particles were put thereinto at a ratio of 3 wt %, and coating was performed on a PET film using a solution having a solid content level of 30% in a normal-butyl acetate solvent, thereby preparing a green light emitting color conversion film. A blue LED light source was used from the prepared green color conversion film, thereby preparing a backlight unit with a size of 160 mm×90 mm. From the prepared backlight unit, optical properties were confirmed.

Comparative Example 4

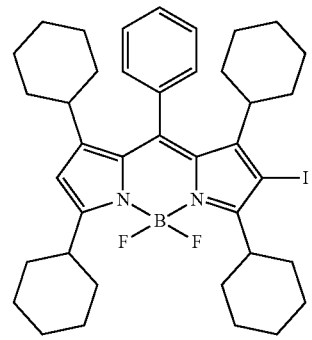

<Compound D>

[Preparation Method D]

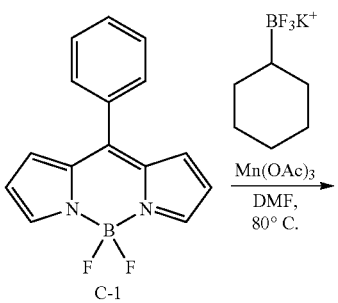

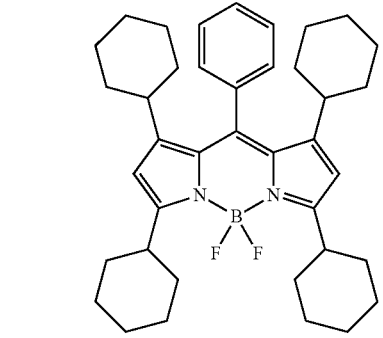

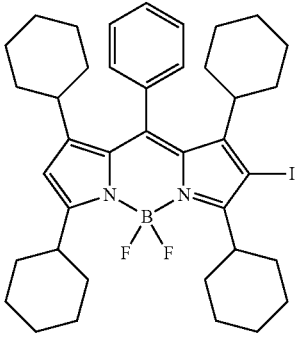

Compound D

<Preparation of D-1>

The method for preparing D-1 was the same as the method for preparing Compound A, and D-1 was prepared using C-1 instead of A-1.

[M−F]$^+$=577

<Preparation of Compound D>

D-1 (1 g, 1.6 mmol) was dissolved in methylene chloride, and then N-iodosuccinimide (NIS)(0.4 g, 1.9 mmol) was put thereinto, and the resulting mixture was stirred at room temperature for 4 hours. After the mixture was cooled to room temperature, the organic layer was extracted using water and chloroform. The extracted organic layer was dried over anhydrous magnesium sulfate and then concentrated, and then Compound D was secured using silica gel column chromatography.

[M−F]⁺=703

¹H NMR (500 MHz, CDCl₃) δ 7.39-7.33 (m, 5H), 5.65 (s, 1H), 2.76-2.70 (m, 2H), 2.26-2.20 (m, 2H), 2.12-2.01 (m, 2H), 1.79-1.54 (m, 12H), 1.53-1.43 (m, 14H), 1.42-1.39 (m, 8H), 1.24-1.10 (m, 4H).

Preparation of Film Using [Compound D]

A green light emitting color conversion film was prepared in the same manner as in Comparative Example 1, except that [Compound D] was used instead of [Compound A] in Comparative Example 1 using the prepared [Compound D], and a blue LED light source was used from the prepared green conversion film, thereby preparing a backlight unit with a size of 160 mm×90 mm. From the prepared backlight unit, optical properties were confirmed.

Example 1

[Compound 1]

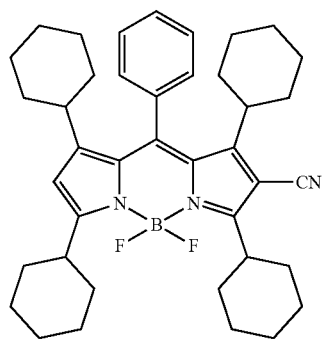

[Preparation Method 1]

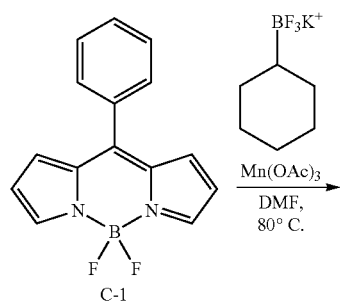

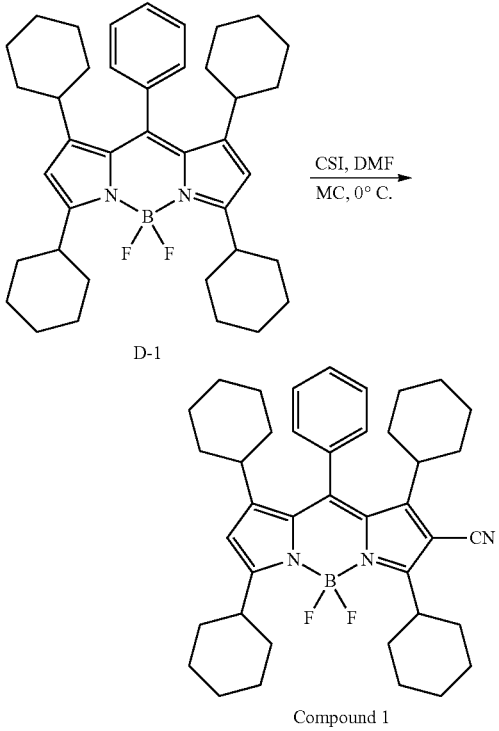

[Preparation of Compound 1] After D-1 (1 g, 1.6 mmol) was dissolved in methylene chloride, chlorosulfonyl isocyanate (0.7 g, 4.8 mmol) was slowly introduced thereinto at 0° C., and then the resulting mixture was stirred for 1 hour. After the stirring was completed, dimethylformamide (1.3 mL, 16 mmol) was introduced thereinto, the resulting mixture was stirred for 1 hour, and then the reaction was terminated, the reaction was neutralized using a 1 N NaOH solution, and then the organic layer was extracted using a saturated NaHCO₃ and methylene chloride, the extracted material was concentrated, and [Compound 1] was secured using column chromatography. [M−F]⁺=602

¹H NMR (500 MHz, CDCl₃) δ 7.59 (d, J=7.5 Hz, 1H), 7.49 (t, J=7.6 Hz, 2H), 7.36 (d, J=7.3 Hz, 2H), 6.33 (s, 1H), 3.44 (s, 1H), 3.32 (s, 1H), 1.99 (t, J=12.0 Hz, 4H), 1.87 (dd, J=31.7, 15.6 Hz, 8H), 1.80-1.72 (m, 4H), 1.44 (ddd, J=44.8, 27.8, 13.8 Hz, 12H), 1.32-1.21 (m, 6H), 1.12 (d, J=11.9 Hz, 2H), 1.05 (dd, J=25.6, 11.5 Hz, 2H), 0.58 (d, J=12.8 Hz, 2H), 0.49 (d, J=12.9 Hz, 2H).

Method for Preparing Film Using [Compound 1]

The prepared [Compound 1] was used for preparing a green light emitting color conversion film. Specifically, [Compound 1] being a green light emitting material was added thereto at a ratio of 0.4 wt % compared to 100 wt % of a SAN polymer, diffuser particles were put thereinto at a ratio of 3 wt %, and coating was performed on a PET film using a solution having a solid content level of 30% in a normal-butyl acetate solvent, thereby preparing a green light emitting color conversion film. A blue LED light source was used from the prepared green color conversion film, thereby preparing a backlight unit with a size of 160 mm×90 mm. From the prepared backlight unit, optical properties were confirmed.

Example 2

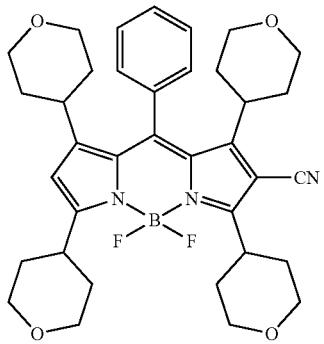

[Compound 2]

[Preparation of Compound 2] The preparation was performed in the same manner as in Preparation Method 1, except that potassium tetrahydro-2H-pyran-4-yl trifluoroborate was used instead of potassium cyclohexyltrifluoroborate using C-1. [M−F]$^+$=610

$^1$H NMR (500 MHz, cdcl$_3$) δ 7.50 (dt, J=12.0, 8.8 Hz, 3H), 7.35 (dd, J=13.4, 7.3 Hz, 2H), 6.20 (s, 1H), 3.78-3.57 (m, 16H), 2.88-2.70 (m, 2H), 2.28 (m, 2H), 1.99-1.71 (m, 12H), 1.70-1.49 (m, 4H).

Preparation of Film Using [Compound 2]

A green light emitting color conversion film was prepared in the same manner as in Example 1, except that [Compound 2] was used instead of [Compound 1] in Example 1 using the prepared [Compound 2], and a blue LED light source was used from the prepared green conversion film, thereby preparing a backlight unit with a size of 160 mm×90 mm. From the prepared backlight unit, optical properties were confirmed.

Example 3

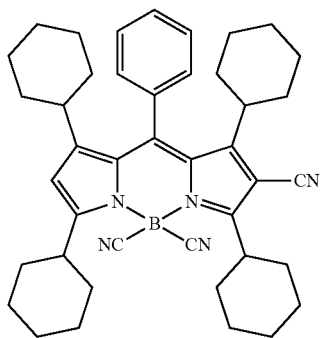

[Compound 3]

[Preparation of Compound 3]

Compound 3 was prepared by using Compound 1 instead of C-5 by using the method for preparing [Compound 4] in Preparation Method C.

[M+H]$^+$=636

$^1$H NMR (500 MHz, cdcl$_3$) δ 7.65 (d, J=7.5 Hz, 2H), 7.58-7.50 (m, 4H), 7.47-7.36 (m, 4H), 6.43 (s, 1H), 2.58-2.46 (m, 2H), 2.34 (d, J=11.4 Hz, 2H), 2.23 (d, J=12.8 Hz, 2H), 2.11 (dd, J=6.6, 3.4 Hz, 2H), 1.98-1.80 (m, 4H), 1.80-1.69 (m, 4H), 1.56-1.19 (m, 24H), 0.79-0.61 (m, 2H), 0.46-0.17 (m, 2H).

Preparation of Film Using [Compound 3]

A green light emitting color conversion film was prepared in the same manner as in Example 1, except that [Compound 3] was used instead of [Compound 1] in Example 1 using the prepared [Compound 3], and a blue LED light source was used from the prepared green conversion film, thereby preparing a backlight unit with a size of 160 mm×90 mm. From the prepared backlight unit, optical properties were confirmed.

Example 4

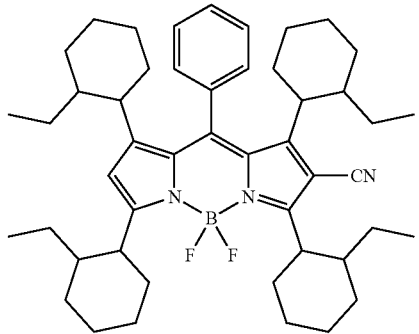

[Compound 4]

[Preparation of Compound 4] The preparation was performed in the same manner as in Preparation Method 1, except that potassium 2-ethyl-cyclohexyltrifluoroborate was used instead of potassium cyclohexyltrifluoroborate using C-1. [M−F]$^+$=714

$^1$H NMR (500 MHz, cdcl$_3$) δ 7.64-7.53 (m, 1H), 7.53-7.43 (m, 2H), 7.33 (dd, J=10.7, 4.1 Hz, 2H), 6.28 (s, 1H), 3.18 (t, J=11.5 Hz, 1H), 3.09 (t, J=11.1 Hz, 1H), 2.15 (d, J=10.7 Hz, 1H), 2.06-1.69 (m 14H), 1.55-1.36 (m, 8H), 1.37-0.91 (m, 16H), 0.91-0.79 (m, 6H), 0.79-0.42 (m, 11H), 0.28 (d, J=11.6 Hz, 1H), 0.08 (d, J=14.1 Hz, 1H).

Preparation of Film Using [Compound 4]

A green light emitting color conversion film was prepared in the same manner as in Example 1, except that [Compound 4] was used instead of [Compound 1] in Example 1 using the prepared [Compound 4], and a blue LED light source was used from the prepared green conversion film, thereby preparing a backlight unit with a size of 160 mm×90 mm. From the prepared backlight unit, optical properties were confirmed.

Example 5

[Compound 5]

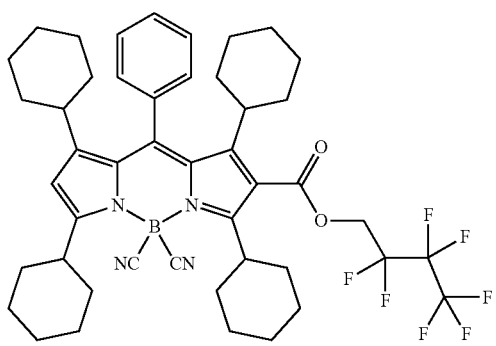

[Preparation of Compound 5] The preparation method was the same as the method for preparing Compound B, and C-5 was used instead of B-2. Compound 5 was prepared using the corresponding method. [M−F]$^+$=803

$^1$H NMR (500 MHz, cdcl$_3$) δ 7.65 (d, J=7.3 Hz, 1H), 7.63-7.65 (m, 2H), 7.47 (dd, J=12.4, 7.6 Hz, 2H), 6.32 (s, 1H), 4.79 (d, J=14.0 Hz, 1H), 4.44 (d, J=13.2 Hz, 1H), 2.06 (d, J=10.9 Hz, 2H), 1.82-1.75 (m, 7H), 1.65-1.07 (m, 28H), 1.05-0.93 (m, 2H), 0.44-0.30 (m, 2H), 0.24-0.19 (m, 1H).

Preparation of Film Using [Compound 5]

A green light emitting color conversion film was prepared in the same manner as in Example 1, except that [Compound 5] was used instead of [Compound 1] in Example 1 using the prepared [Compound 5], and a blue LED light source was used from the prepared green conversion film, thereby preparing a backlight unit with a size of 160 mm×90 mm. From the prepared backlight unit, optical properties were confirmed.

Example 6

[Compound 6]

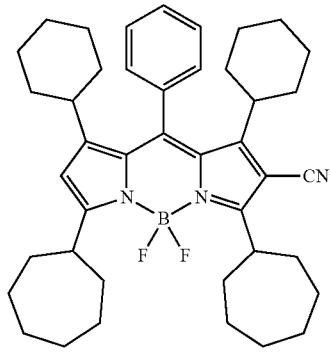

[Preparation Method 2]

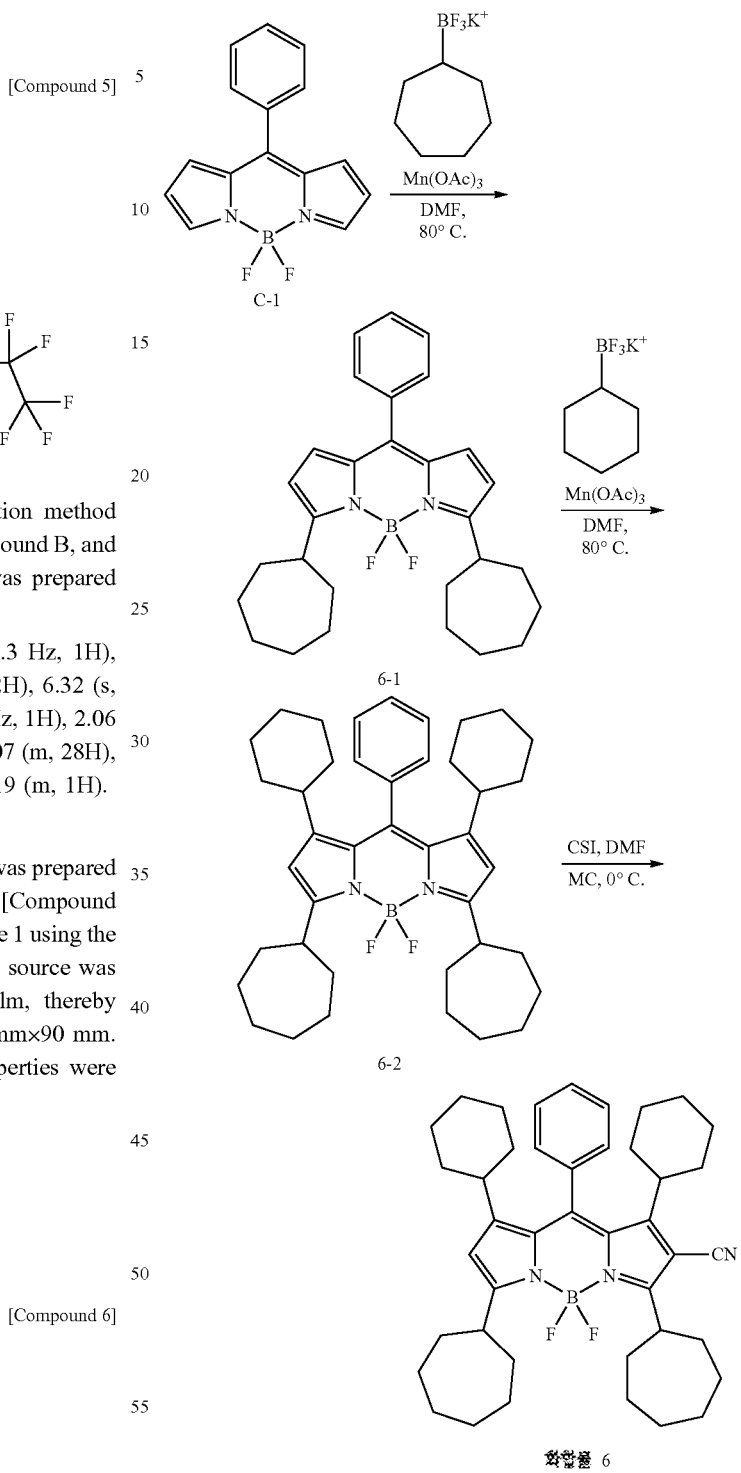

[Preparation of 6-1] After C-1 (1 g, 3.7 mmol) was dissolved in dimethylformamide, potassium cycloheptyltrifluoroborate (1.7 g, 8.1 mmol) and Mn(OAc)$_3$ (4.8 g, 18 mmol) were added thereto, the resulting mixture was stirred at 80° C. for 4 hours, and then the reaction was terminated. The organic layer was extracted using water and ethyl acetate, the extracted material was concentrated, and 6-1 was secured using column chromatography.

[M−F]$^+$=441

[Preparation of 6-2] After 6-1 (0.9 g, 2.0 mmol) was dissolved in dimethylformamide, potassium cyclohexyltrifluoroborate (0.8 g, 4.4 mmol) and Mn(OAc)$_3$ (2.7 g, 10 mmol) were added thereto, the resulting mixture was stirred at 80° C. for 1 hour, and then the reaction was terminated. The organic layer was extracted using water and ethyl acetate, the extracted material was concentrated, and 6-2 was secured using column chromatography.

[M−F]$^+$=605

[Preparation of Compound 6] The preparation method was the same as the method for preparing Compound 1 in Preparation Method 1, and Compound 6 was prepared using 6-2 instead of D-1.

[M−F]$^+$=630

$^1$H NMR (500 MHz, CDCl$_3$) δ 7.59 (d, J=7.5 Hz, 1H), 7.49 (t, J=7.6 Hz, 2H), 7.36 (d, J=7.3 Hz, 2H), 6.33 (s, 1H), 3.44 (s, 1H), 3.32 (s, 1H), 1.99 (t, J=12.0 Hz, 4H), 1.85 (m, 10H), 1.78-1.68 (m, 6H), 1.40-1.34 (m, 16H), 1.32-1.21 (m, 6H), 1.10 (d, J=11.9 Hz, 2H), 1.0 (dd, J=24.0, 11.5 Hz, 2H), 0.54 (d, J=12.5 Hz, 2H), 0.38 (d, J=12.5 Hz, 2H).

Preparation of Film Using [Compound 6]

A green light emitting color conversion film was prepared in the same manner as in Example 1, except that [Compound 6] was used instead of [Compound 1] in Example 1 using the prepared [Compound 6], and a blue LED light source was used from the prepared green conversion film, thereby preparing a backlight unit with a size of 160 mm×90 mm. From the prepared backlight unit, optical properties were confirmed.

Comparative Examples 1 to 4 and Examples 1 to 6 were dissolved in toluene, optical properties of each of the solutions prepared at 10$^{-5}$ [M] were measured by UV-vis and fluorescence, and the measured values are shown in the following Table 4.

TABLE 4

|  | Comparative Example 1 | Comparative Example 2 | Comparative Example 3 | Comparative Example 4 | Example 1 | Example 2 | Example 3 | Example 4 | Example 5 | Example 6 |
|---|---|---|---|---|---|---|---|---|---|---|
| Maximum absorption wavelength [nm] | 513 | 520 | 519 | 544 | 504 | 510 | 508 | 505 | 512 | 506 |
| Maximum light emitting wavelength [nm] | 525 | 531 | 530 | 557 | 517 | 522 | 521 | 523 | 523 | 519 |

The maximum light emitting wavelengths of the films in Comparative Examples 1 to 4 and Examples 1 to 6 were measured by a luminance meter, and are shown in the following Table 5.

TABLE 5

| Film | Comparative Example 1 | Comparative Example 2 | Comparative Example 3 | Comparative Example 4 | Example 1 | Example 2 | Example 3 | Example 4 | Example 5 | Example 6 |
|---|---|---|---|---|---|---|---|---|---|---|
| Maximum light emitting wavelength [nm] | 539 | 545 | 544 | 568 | 533 | 537 | 536 | 533 | 540 | 534 |

The light fastnesses of the films prepared in Comparative Examples 1 to 4 and Examples 1 to 6 were compared, and are shown in Table 6. A variation in green intensity compared to the initial value was described as %.

<Method for Measuring Light Fastness>

A backlight unit with a size of 160 mm×90 mm was prepared using a blue LED light source. Optical properties of a green conversion film prepared from the prepared backlight unit were confirmed, and the prepared backlight unit was continuously driven in a chamber at a temperature of 60° C., thereby evaluating light fastness of the green light emitting film.

TABLE 6

| | % Green Intensity (% compared to the initial value) | | | | | | | | | |
|---|---|---|---|---|---|---|---|---|---|---|
| Film | Comparative Example 1 | Comparative Example 2 | Comparative Example 3 | Comparative Example 4 | Example 1 | Example 2 | Example 3 | Example 4 | Example 5 | Example 6 |
| 500 hours | 89% | 90% | 89% | 83% | 90% | 90% | 92% | 92% | 91% | 91% |

The durabilities of the compounds in Comparative Examples 1 to 4 and the compounds in Examples 1 to 6 are all excellent, but the light emitting wavelengths of the compounds in Comparative Examples 1 to 4 are in a long wavelength region, so that it is difficult to apply the compounds to a high color gamut display.

<Measurement of Dipole Moment>

When R1, R3, R5, and R7 were a cycloalkyl group, an aryl group, or a heteroaryl group, the bulkiness was increased, so that the durability is enhanced, but since the light emitting wavelength was in a long wavelength region, there is a disadvantage in that it is difficult to apply the compound to a high color gamut display, and in the case of an asymmetric compound, the light emitting wavelength is shifted to the short wavelength region, the dipole moment values of the following compounds E, A, 1, B, 5, and C were calculated using a DMol3 program in order to quantify the asymmetry, and the values are shown in the following Table 7.

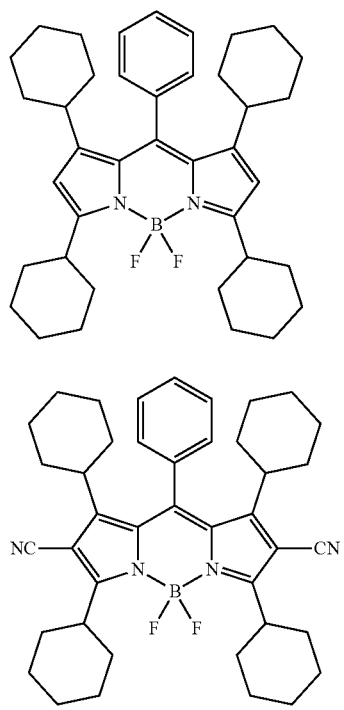

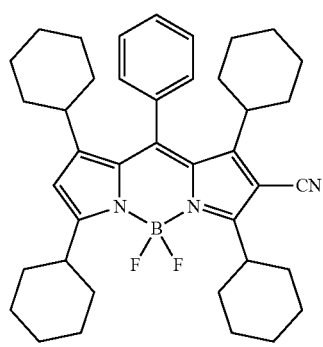

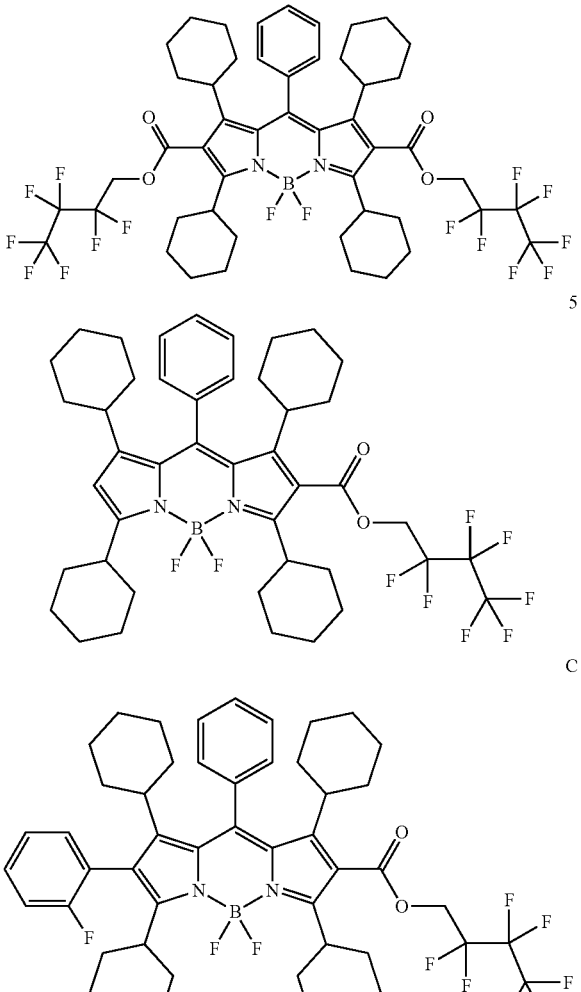

TABLE 7

| Compound | E | A | 1 | B | 5 | C |
|---|---|---|---|---|---|---|
| Dipole moment | 4.1 | 4.76 | 7.32 | 4.72 | 5.45 | 5.62 |

Compounds 1 and 5 are the compound of Chemical Formula 1 of the present invention, and E, A, B, and C are the compounds in the Comparative Examples. It could be confirmed that the dipole moment value of Compound 1 was significantly increased as compared to those of Compounds E and A, and it could be confirmed that the dipole moment value of Compound 5 was also increased as compared to that of Compound B.

It could be seen that the dipole moment value of Compound C was similar to that of Compound 5, but it could be seen that Compound 5 had a lower light emitting wavelength and a lower absorption wavelength than those of Comparative Example 3 and Example 5 in Tables 4 and 5. It could be seen that the case where R6 was hydrogen had a shorter BODIPY structure conjugation than the case where R6 was aryl, and thus emits light in a short wavelength region.

EXPLANATION OF REFERENCE NUMERALS AND SYMBOLS

101: Side chain-type light source
102: Reflective plate
103: Light guide plate
104: Reflective layer
105: Color conversion film
106: Light dispersion pattern

The invention claimed is:

1. A compound represented by the following Chemical Formula 1:

[Chemical Formula 1]

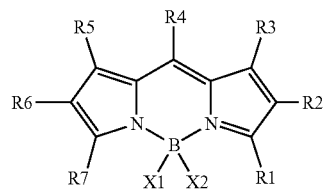

in Chemical Formula 1,
R2 is a cyano group,
R6 is hydrogen,
R4 is a substituted or unsubstituted aryl group,
R1, R3, R5, and R7 are the same as or different from each other, and are each independently a substituted or unsubstituted cycloalkyl group; or a substituted or unsubstituted aliphatic heterocyclic group, and
X1 and X2 are the same as or different from each other, and are each independently a halogen group or a cyano group.

2. The compound of claim 1, wherein R1, R3, R5, and R7 are the same as or different from each other, and are each independently a substituted or unsubstituted cyclohexyl group; a substituted or unsubstituted cyclopentyl group; a substituted or unsubstituted cycloheptyl group; a substituted or unsubstituted cyclooctyl group; a substituted or unsubstituted bicycloheptyl group; a substituted or unsubstituted bicyclooctyl group; or a substituted or unsubstituted tetrahydropyran group.

3. The compound of claim 1, wherein R1, R3, R5, and R7 are a substituted or unsubstituted cyclohexyl group.

4. The compound of claim 1, wherein R4 is a substituted or unsubstituted phenyl group.

5. The compound of claim 1, wherein R1, R3, R5, and R7 are selected from the combinations consisting of 1A to 9A, 14A to 37A, 40A to 55A, and 82A-83A of the following Table 1, R4 is selected from the combinations consisting of 4C to 32C of the following Table 3, and X1 and X2 are selected from the combinations consisting of 1D to 3D of the following Table 4:

TABLE 1

| Combination | R1 | R3 | R5 | R7 |
|---|---|---|---|---|
| 1A | cyclohexyl | cyclohexyl | cyclohexyl | cyclohexyl |
| 2A | 2-methylcyclohexyl (wedge) | 2-methylcyclohexyl (wedge) | 2-methylcyclohexyl (wedge) | 2-methylcyclohexyl (wedge) |
| 3A | 2-methylcyclohexyl (dash) | 2-methylcyclohexyl (dash) | 2-methylcyclohexyl (dash) | 2-methylcyclohexyl (dash) |
| 4A | 2-methylcyclohexyl (wedge) | cyclohexyl | cyclohexyl | 2-methylcyclohexyl (wedge) |

TABLE 1-continued

| Combination | R1 | R3 | R5 | R7 |
|---|---|---|---|---|
| 5A | 2-methylcyclohexyl | cyclohexyl | cyclohexyl | 2-methylcyclohexyl |
| 6A | 2-methylcyclohexyl | 2-methylcyclohexyl | cyclohexyl | 2-methylcyclohexyl |
| 7A | 2-methylcyclohexyl | 2-methylcyclohexyl | cyclohexyl | 2-methylcyclohexyl |
| 8A | cyclohexyl | 2-methylcyclohexyl | cyclohexyl | 2-methylcyclohexyl |
| 9A | cyclohexyl | 2-methylcyclohexyl | cyclohexyl | 2-methylcyclohexyl |
| 14A | cyclopentyl | cyclopentyl | cyclopentyl | cyclopentyl |
| 15A | cyclopentyl | cyclopentyl | cyclohexyl | cyclopentyl |
| 16A | cycloheptyl | cycloheptyl | cycloheptyl | cycloheptyl |

TABLE 1-continued
| Combination | R1 | R3 | R5 | R7 |
|---|---|---|---|---|
| 17A | 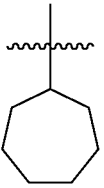 [SMILES: *C1CCCCCC1] | 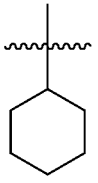 | 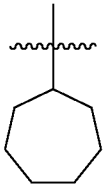 [SMILES: *C1CCCCCC1] | 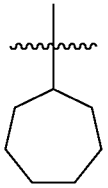 |
| 18A | 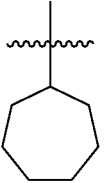 [SMILES: *C1CCCCCC1] | 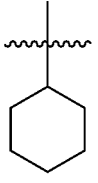 | 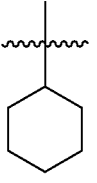 | 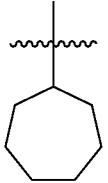 |
| 19A | 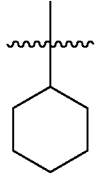 | 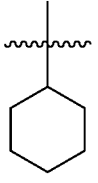 | 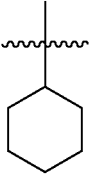 | 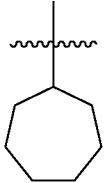 |
| 20A | 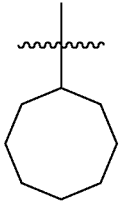 [SMILES: *C1CCCCCCC1] | 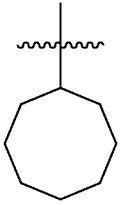 [SMILES: *C1CCCCCCC1] | 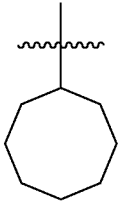 [SMILES: *C1CCCCCCC1] | 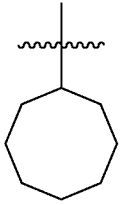 |
| 21A | 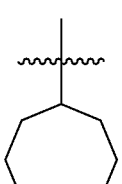 | 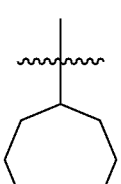 | 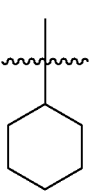 | 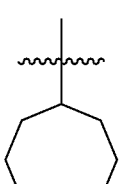 |
| 22A | 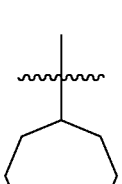 | 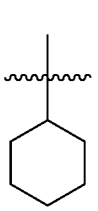 | 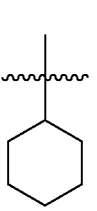 | 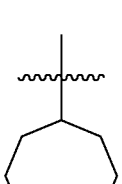 |
| 23A | 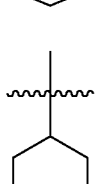 | 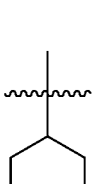 | 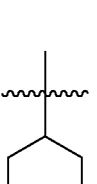 | 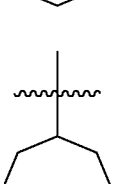 |

TABLE 1-continued

| Combination | R1 | R3 | R5 | R7 |
|---|---|---|---|---|
| 24A | tetrahydropyran | tetrahydropyran | tetrahydropyran | tetrahydropyran |
| 25A | tetrahydropyran | tetrahydropyran | cyclohexyl | tetrahydropyran |
| 26A | tetrahydropyran | cyclohexyl | cyclohexyl | tetrahydropyran |
| 27A | cyclohexyl | cyclohexyl | cyclohexyl | tetrahydropyran |
| 28A | norbornyl | norbornyl | norbornyl | norbornyl |
| 29A | norbornyl | cyclohexyl | norbornyl | norbornyl |
| 30A | norbornyl | cyclohexyl | cyclohexyl | norbornyl |
| 31A | cyclohexyl | cyclohexyl | cyclohexyl | norbornyl |

TABLE 1-continued

| Combination | R1 | R3 | R5 | R7 |
|---|---|---|---|---|
| 32A | cyclohexyl with CH₃ | cyclohexyl | cyclohexyl | norbornyl |
| 33A | cyclohexyl with CH₃ | cycloheptyl | cyclohexyl | norbornyl |
| 34A | phenyl-norbornyl | phenyl-norbornyl | phenyl-norbornyl | phenyl-norbornyl |
| 35A | phenyl-norbornyl | cyclohexyl | cyclohexyl | phenyl-norbornyl |
| 36A | adamantyl | cyclohexyl | cyclohexyl | adamantyl |
| 37A | cyclohexyl | cyclohexyl | cyclohexyl | adamantyl |
| 40A | cyclohexyl with OCH₃ | cyclohexyl with OCH₃ | cyclohexyl with OCH₃ | cyclohexyl with OCH₃ |

TABLE 1-continued

| Combination | R1 | R3 | R5 | R7 |
|---|---|---|---|---|
| 41A | cyclohexyl-OCH₃ (wedge) | cyclohexyl-OCH₃ (wedge) | cyclohexyl-OCH₃ (wedge) | cyclohexyl-OCH₃ (wedge) |
| 42A | cyclohexyl-OCH₃ (dash) | cyclohexyl-OCH₃ (dash) | cyclohexyl | cyclohexyl-OCH₃ (dash) |
| 43A | cyclohexyl-OCH₃ (wedge) | cyclohexyl-OCH₃ (wedge) | cyclohexyl | cyclohexyl-OCH₃ (wedge) |
| 44A | cyclohexyl-OCH₃ (dash) | cyclohexyl | cyclohexyl | cyclohexyl-OCH₃ (dash) |
| 45A | cyclohexyl-OCH₃ (wedge) | cyclohexyl | cyclohexyl | cyclohexyl-OCH₃ (wedge) |
| 46A | cyclohexyl | cyclohexyl | cyclohexyl | cyclohexyl-OCH₃ (dash) |
| 47A | cyclohexyl | cyclohexyl | cyclohexyl | cyclohexyl-OCH₃ (wedge) |
| 48A | cyclohexyl | cyclohexyl-OCH₃ (dash) | cyclohexyl | cyclohexyl-OCH₃ (dash) |

TABLE 1-continued

| Combination | R1 | R3 | R5 | R7 |
|---|---|---|---|---|
| 49A | cyclohexyl | cyclohexyl-OCH₃ (trans) | cyclohexyl | cyclohexyl-OCH₃ (trans) |
| 50A | cyclohexyl-CH₃ (cis) | cyclohexyl-OCH₃ (trans) | cyclohexyl-OCH₃ (cis) | cyclohexyl-CH₃ (cis) |
| 51A | cyclohexyl-CH₃ (trans) | cyclohexyl-OCH₃ (trans) | cyclohexyl-OCH₃ (trans) | cyclohexyl-CH₃ (trans) |
| 52A | cyclohexyl-CH₃ (cis) | cyclohexyl-OCH₃ | cyclohexyl | cyclohexyl-CH₃ (cis) |
| 53A | cyclohexyl-CH₃ (trans) | cyclohexyl-OCH₃ (trans) | cyclohexyl | cyclohexyl-CH₃ (trans) |
| 54A | cyclohexyl | cyclohexyl-OCH₃ (trans) | cyclohexyl | cyclohexyl-CH₃ (trans) |
| 55A | cyclohexyl | cyclohexyl-OCH₃ (trans) | cyclohexyl | cyclohexyl-CH₃ (trans) |
| 82A | tetrahydropyran-4-yl | tetrahydropyran-4-yl | tetrahydropyran-4-yl | tetrahydropyran-4-yl |

TABLE 1-continued

| Combination | R1 | R3 | R5 | R7 |
|---|---|---|---|---|
| 83A | 2-ethylcyclohexyl | 2-ethylcyclohexyl | 2-ethylcyclohexyl | 2-ethylcyclohexyl |

TABLE 3

| Combination | R4 |
|---|---|
| 4C | phenyl |
| 5C | 4-cyanophenyl |
| 6C | 3-cyanophenyl |
| 7C | 2-cyanophenyl |
| 8C | 4-fluorophenyl |
| 9C | 3-fluorophenyl |
| 10C | 2-fluorophenyl |
| 11C | 4-(trifluoromethyl)phenyl |
| 12C | 3-(trifluoromethyl)phenyl |
| 13C | 2-(trifluoromethyl)phenyl |
| 14C | 4-nitrophenyl |
| 15C | 3-nitrophenyl |

TABLE 3-continued
| Combination | R4 |
|---|---|
| 16C | 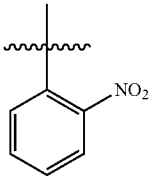 [SMILES: *c1ccccc1[N+](=O)[O-]] |
| 17C | 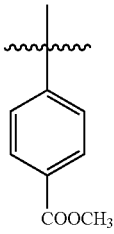 |
| 18C | 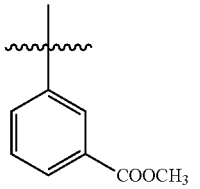 [SMILES: *c1cccc(C(=O)OC)c1] |
| 19C | 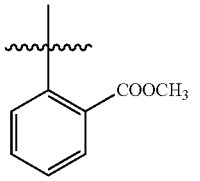 [SMILES: *c1ccccc1C(=O)OC] |
| 20C | 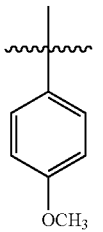 |
| 21C | 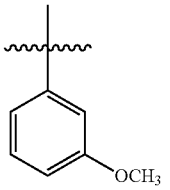 |
| 22C | 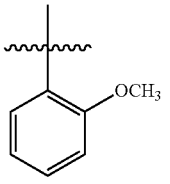 [SMILES: *c1ccccc1OC] |
| 23C | 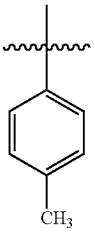 |
| 24C | 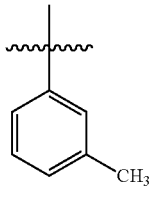 [SMILES: *c1cccc(C)c1] |
| 25C | 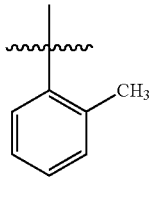 [SMILES: *c1ccccc1C] |
| 26C | 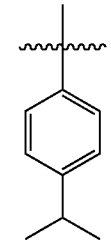 [SMILES: *c1ccc(C(C)C)cc1] |
| 27C | 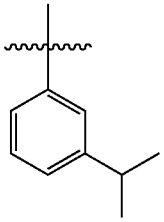 [SMILES: *c1cccc(C(C)C)c1] |
| 28C | 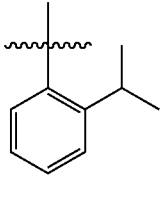 [SMILES: *c1ccccc1C(C)C] |
| 29C | 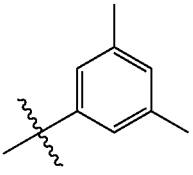 [SMILES: *c1cc(C)cc(C)c1] |

TABLE 3-continued

| Combination | R4 |
|---|---|
| 30c | 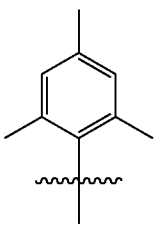 |
| 31C | 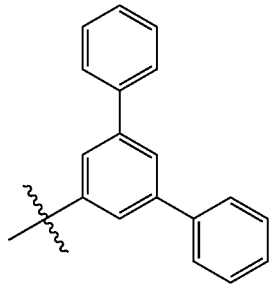 [SMILES: *c1cc(-c2ccccc2)cc(-c2ccccc2)c1] |
| 32C | 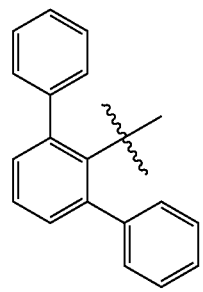 [SMILES: *c1c(-c2ccccc2)cccc1-c1ccccc1] |

TABLE 4

| Combination | X1 | X2 |
|---|---|---|
| 1D | —F | —F |
| 2D | —CN | —CN |
| 3D | —F | —CN. |

6. The compound of claim 1, wherein the compound of Chemical Formula 1 has a maximum absorption peak which is 1 nm to 30 nm lower than that of a compound in which R6 is the same as R2, and R1, R3 to R5, R7, X1, and X2 are the same as R1, R3 to R5, R7, X1, and X2 of the compound of Chemical Formula 1 respectively.

7. The compound of claim 1, wherein the compound of Chemical Formula 1 has a maximum light emission peak which is 1 nm to 30 nm lower than that of a compound in which R6 is the same as R2, and R1, R3 to R5, R7, X1, and X2 are the same as R1, R3 to R5, R7, X1, and X2 of the compound of Chemical Formula 1 respectively.

8. A color conversion film comprising:

a resin matrix; and the compound represented by Chemical Formula 1 according to claim 1, which is dispersed in the resin matrix.

9. A backlight unit comprising the color conversion film according to claim 8.

10. A display apparatus comprising the backlight unit according to claim 9.

* * * * *